(12) United States Patent
Fehri et al.

(10) Patent No.: US 9,659,120 B2
(45) Date of Patent: May 23, 2017

(54) BASEBAND EQUIVALENT VOLTERRA SERIES FOR DIGITAL PREDISTORTION IN MULTI-BAND POWER AMPLIFIERS

(71) Applicant: Telefonaktiebolaget LM Ericsson (publ), Stockholm (SE)

(72) Inventors: Bilel Fehri, Waterloo (CA); Slim Boumaiza, Waterloo (CA)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 14/889,057

(22) PCT Filed: May 15, 2014

(86) PCT No.: PCT/IB2014/061476
§ 371 (c)(1),
(2) Date: Nov. 4, 2015

(87) PCT Pub. No.: WO2014/184774
PCT Pub. Date: Nov. 20, 2014

(65) Prior Publication Data
US 2016/0079933 A1   Mar. 17, 2016

Related U.S. Application Data

(60) Provisional application No. 61/824,075, filed on May 16, 2013, provisional application No. 61/886,907, (Continued)

(51) Int. Cl.
*H04K 1/02* (2006.01)
*H04L 25/03* (2006.01)
(Continued)

(52) U.S. Cl.
CPC .......... *G06F 17/5036* (2013.01); *G06F 17/10* (2013.01); *G06F 17/18* (2013.01);
(Continued)

(58) Field of Classification Search
CPC .......... H03F 1/3247; H03F 3/189; H03F 3/24; H03F 2200/111; H03F 2200/336;
(Continued)

(56) References Cited

U.S. PATENT DOCUMENTS 6,236,837 B1 * 5/2001 Midya ................... H03F 1/3247
    330/149
8,340,603 B2 * 12/2012 Brown .................... H03F 1/26
    455/114.3

(Continued)

OTHER PUBLICATIONS

S. Benedetto etal.,"Modeling and Performance Evaluation of Nonlinear Satellite Links a Volterra Series Approach," Published in: IEEE Transactions on Aerospace and Electronic Systems, vol. AES-15(4):494-507, Publication Date: Jul. 1979, consisting of 14-pages.

(Continued)

*Primary Examiner* — Phuong Phu
(74) *Attorney, Agent, or Firm* — Christopher & Weisberg, P.A.

(57) ABSTRACT

Methods, systems and apparatus for modelling a power amplifier and pre-distorter fed by a multi-band signal are disclosed. According to one aspect, a method includes receiving a multi-band signal and generating a discrete base band equivalent, BBE, Volterra series based on the received multi-band signal, where the series has distortion products grouped according to determined shared kernels. The shared kernels are determined based on a transformation of a real-valued continuous-time pass band Volterra series without pruning of kernels.

21 Claims, 14 Drawing Sheets

Related U.S. Application Data filed on Oct. 4, 2013, provisional application No. 61/887,012, filed on Oct. 4, 2013.

(51) Int. Cl.

| | |
|---|---|
| *H04L 25/49* | (2006.01) |
| *G06F 17/50* | (2006.01) |
| *H03F 1/32* | (2006.01) |
| *H03F 3/189* | (2006.01) |
| *H03F 3/24* | (2006.01) |
| *H04L 27/36* | (2006.01) |
| *G06F 17/10* | (2006.01) |
| *H03F 1/02* | (2006.01) |
| *H03F 3/19* | (2006.01) |
| *H03F 3/21* | (2006.01) |
| *G06F 17/18* | (2006.01) |

(52) U.S. Cl.
CPC ......... *H03F 1/0205* (2013.01); *H03F 1/3247* (2013.01); *H03F 3/189* (2013.01); *H03F 3/19* (2013.01); *H03F 3/21* (2013.01); *H03F 3/24* (2013.01); *H04L 27/368* (2013.01); *H03F 2200/111* (2013.01); *H03F 2200/336* (2013.01); *H03F 2200/451* (2013.01); *H03F 2201/3206* (2013.01); *H03F 2201/3209* (2013.01); *H03F 2201/3224* (2013.01)

(58) Field of Classification Search
CPC ..... H03F 2201/3209; H03F 2201/3224; H03F 1/0205; H03F 3/19; H03F 3/21; H03F 2200/451; H03F 2201/3206; H03F 1/26; H04L 27/368; G06F 17/10
USPC ................ 375/297, 296; 455/114.3; 330/149
See application file for complete search history.

(56) References Cited

U.S. PATENT DOCUMENTS

| | | |
|---|---|---|
| 2007/0237260 A1 | 10/2007 | Hori et al. |
| 2008/0130787 A1 | 6/2008 | Copeland |
| 2011/0064171 A1 | 3/2011 | Huang et al. |
| 2013/0094610 A1 | 4/2013 | Ghannouchi et al. |
| 2016/0191020 A1 | 6/2016 | Velazquez |

OTHER PUBLICATIONS

S. Boyd and L. Chua, "Fading Memory and the Problem of Approximating Nonlinear Operators with Volterra Series," Published in: IEEE Transactions on Circuits and Systems, vol. 32(11):1150-1161, Publication Date: Nov. 1985, consisting of 12-pages.
G. Karam and H. Sari, "Improved Data Predistortion using Intersymbol Interpolation," Published in: 1989 Communications, ICC '89, BOSTONICC/89. Conference record. IEEE International Conference on 'World Prosperity Through Communications', (vol. 1:286-291), Date of Conference: Jun. 11-14, 1989, Boston, MA, USA, consisting of 6-pages.
A.J. Redfern and G.Tong Zhou, "Decision Feedback Equalization for Volterra Systems—A Root Method," Published in: 1998 Conference Record of the Thirty-Second Asilomar Conference on Signals, Systems & Computers, vol. 1:47-51, Date of Conference: Nov. 1-4, 1998, Pacific Grove, CA, USA, consisting of 5-pages.
A. Gutierrez and W.E. Ryan, "Performance of Volterra and MLSD Receivers for Nonlinear Band-Limited Satellite Systems," Published in: IEEE Transactions on Communications, vol. 48(7):1171-1177, Publication Date: Jul. 2000, consisting of 7-pages.
Chi-Hao Cheng and E.J. Powers, "Optimal Volterra Kernel Estimation Algorithms for a Nonlinear Communication System for PSK and QAM Inputs," Published in: IEEE Transactions on Signal Processing, vol. 49(1):147-163, Publication Date: Jan. 2001, consisting of 17-pages.
M. Iwamoto etal., "An Extended Doherty Amplifier With High Efficiency Over a Wide Power Range," Published in: 2001 IEEE MTT-S International Microwave Symposium Digest, vol. 2:931-934, Date of Conference: May 20-24, 2001, Phoenix, AZ, USA, consisting of 8-pages.
A.J. Redfern and G,T, Zhou., "Blind Zero Forcing Equalization of Multichannel Nonlinear CDMA Systems," Published in: IEEE Transactions on Signal Processing, vol. 49(10):2363-2371, Date of Publication: Oct. 2001, consisting of 9-pages.
J. Kim and K. Konstantinou, "Digital Predistortion of Wideband Signals Based on Power Amplifier Model with Memory," Published in: Electronics Letters, vol. 37(23):1417-1418, Date of Publication: Nov. 8, 2001, consisting of 2-pages.
D. Mirri etal., "A Modified Volterra Series Approach for Nonlinear Dynamic Systems Modeling," Published in: IEEE Transactions on Circuits and Systems I: Fundamental Theory and Applications, vol. 49(8):1118-1128, Date of Publication: Aug. 2002, consisting of 11-pages.
R. Raich and G.Tong Zhou, "Orthogonal Polynomials for Complex Gaussian Processes," Published in: IEEE Transactions on Signal Processing, vol. 52(10):2788-2797, Date of Publication: Oct. 2004, consisting of 10-pages.
M. Green and A.M. Zoubir, "Selection of a Time-Varying Quadratic Volterra Model Using a Wavelet Packet Basis Expansion," Published in: IEEE Transactions on Signal Processing, vol. 52(10):2721-2728, Date of Publication: Oct. 2004, consisting of 8-pages.
A. Zhu and T.J. Brazil, "Behavioral Modeling of RF Power Amplifiers Based on Pruned Volterra Series," Published in: IEEE Microwave and Wireless Components Letters, vol. 14(12):563-565, Date of Publication: Dec. 2004, consisting of 3-pages.
J.C. Pedro and S.A. Maas, "A Comparative Overview of Microwave and Wireless Power-Amplifier Behavioral Modeling Approaches," Published in: IEEE Transactions on Microwave Theory and Techniques, vol. 53(4)1150-1163, Date of Publication: Apr. 2005, consisting of 14-pages.
J. Kim etal., "Optimum Operation of Asymmetrical-Cells-Based Linear Doherty Power Amplifiers-Uneven Power Drive and Power Matching," Published in: IEEE Transactions on Microwave Theory and Techniques, vol. 53 (5)1802-1809, Date of Publication: May 2005, consisting of 8-pages.
P. Singerl and H. Koeppl, "Volterra Kernel Interpolation for System Modeling and Predistortion Purposes," Published in: 2005 International Symposium Signals, Circuits and Systems (ISSCS 2005), vol. 1:251-254, Date of conference: Jul. 14-15, 2005, consisting of 4-pages.
M. Isaksson etal., "Wide-Band Dynamic Modeling of Power Amplifiers Using Radial-Basis Function Neural Networks,"Published in: IEEE Transactions on Microwave Theory and Techniques, vol. 53(11):3422-3428, Date of Publication: Nov. 2005, consisting of 7-pages.
P.L. Gilabert etal., "On the Wiener and Hammerstein Models for Power Amplifier Predistortion," Published in: 2005 Microwave Conference Proceedings from Asia-Pacific Conference Proceedings (APMC 2005), vol. 2, Date of Conference: Dec. 4-7, 2005, consisting of 4-pages.
M. Isaksson etal., "A Comparative Analysis of Behavioral Models for RF Power Amplifiers," Published in: IEEE Transactions on Microwave Theory and Techniques, vol. 54(1):348-359, Date of Publication: Jan. 2006, consisting of 12-pages.
A. Zhu etal., "Simplified Volterra Series Based Behavioral Modeling of RF Power Amplifiers Using Deviation-Reduction," Published in: 2006 IEEE MTT-S International Microwave Symposium Digest, pp. 1113-1116, Date of Conference: Jun. 11-16, 2006, San Francisco, CA, USA, consisting of 4-pages.
J. Wood etal., "Envelope-Domain Time Series (ET) Behavioral Model of a Doherty RF Power Amplifier for System Design," Published in: IEEE Transactions on Microwave Theory and Techniques, vol. 54(8):3163-3172, Date of Publication: Aug. 2006, consisting of 10-pages.

(56) References Cited

OTHER PUBLICATIONS

D.R Morgan etal., "A Generalized Memory Polynomial Model for Digital Predistortion of RF Power Amplifiers," Published in: IEEE Transactions on Signal Processing, vol. 54(10):3852-3860, Date of Publication: Oct. 2006, consisting of 8-pages.

D.F. Kimball etal., "High-Efficiency Envelope-Tracking W-CDMA Base-Station Amplifier Using GaN HFETs," Published in: IEEE Transactions on Microwave Theory and Techniques, vol. 54(11):3848-3856, Date of Publication: Nov. 2006, consisting of 9-pages.

A. Zhu etal., "Dynamic Deviation Reduction-Based Volterra Behavioral Modeling of RF Power Amplifiers," Published in: IEEE Transactions on Microwave Theory and Techniques, vol. 54(12):4323-4332, Date of Publication: Dec. 2006, consisting of 10-pages.

I. Cherif etal., "On the Identification of Nonlinear Digital Transmission Channels," Published in: 2006 1st IEEE International Conference on E-Learning in Industrial Electronics, pp. 185-190, Date of Conference: Dec. 18-20, 2006, Hammamet, Tunisia consisting of 6-pages.

P. Roblin etal., "Frequency-Selective Predistortion Linearization of RF Power Amplifiers," Published in: IEEE Transactions on Microwave Theory and Techniques, vol. 56(1):65-76, Date of Publication: Jan. 2008, consisting of 12-pages.

J. Zhai etal., "Dynamic Behavioral Modeling of Power Amplifiers Using ANFIS-Based Hammerstein," Published in: IEEE Microwave and Wireless Components Letters, vol. 18(10):704-706, Date of Publication: Oct. 2008, consisting of 3-pages.

A. Cidronali etal., "A New Approach for Concurrent Dual-Band IF Digital PreDistortion: System Design and Analysis," Published in: 2008 Workshop on Integrated Nonlinear Microwave and Millimetre-Wave Circuits (INMMIC 2008), pp. 127-130, Date of Conference: Nov. 24-25, 2008, Malaga, Spain consisting of 4-pages.

F. Mkadem and S. Boumaiza, "Extended Hammerstein Behavioral Model Using Artificial Neural Networks," Published in: IEEE Transactions on Microwave Theory and Techniques, vol. 57(4):745-751, Date of Publication: Mar. 16, 2009, consisting of 7-pages.

C. Crespo-Cadenas etal., "A New Approach to Pruning Volterra Models for Power Amplifiers," Published in: IEEE Published in: IEEE Transactions on Signal Processing, vol. 58(4):2113-2120, Date of Publication: Jan. 8, 2010, consisting of 8-pages.

D. Wu etal., "Design of a Broadband and Highly Efficient 45W GaN Power Amplifier via Simplified Real Frequency Technique," Published in: 2010 IEEE MTT-S International Microwave Symposium Digest, (MTT), pp. 1090-1093, Date of Conference: May 23-28, 2010, Anaheim, CA, USA, consisting of 4-pages.

I. Kim etal., "Optimized Design of a Highly Efficient Three-Stage Doherty PA Using Gate Adaptation," Published in: IEEE Transactions on Microwave Theory and Techniques, vol. 58(10):2562-2574, Date of Publication: Aug. 30, 2010, consisting of 13-pages.

D. Kang etal. "A Multimode/Multiband Power Amplifier With a Boosted Supply Modulator," Published in: IEEE Transactions on Microwave Theory and Techniques, vol. 58(10):2598-2608, Date of Publication: Sep. 2, 2010, consisting of 11-pages.

Morteza Nick and Amir Mortazawi, "Adaptive Input-Power Distribution in Doherty Power Amplifiers for Linearity and Efficiency Enhancement," Published in: IEEE Transactions on Microwave Theory and Techniques, vol. 58 (11):2764-2771, Date of Publication: Oct. 18, 2010, consisting of 8-pages.

T. Cunha etal., "Validation and Physical Interpretation of the Power-Amplifier Polar Volterra Model," Published in: IEEE Transactions on Microwave Theory and Techniques, vol. 58(12):4012-4021, Date of Publication: Nov. 15, 2010, consisting of 10-pages.

F. Mkadem and S. Boumaiza, "Physically Inspired Neural Network Model for RF Power Amplifier Behavioral Modeling and Digital Predistortion," Published in: IEEE Transactions on Microwave Theory and Techniques, vol. 59 (4):913-923, Date of Publication: Jan. 6, 2011, consisting of 11-pages.

K. Bathich etal., "Frequency Response Analysis and Bandwidth Extension of the Doherty Amplifier," Published in: IEEE Transactions on Microwave Theory and Techniques, vol. 59(4):934-944, Date of Publication: Jan. 13, 2011, consisting of 11-pages.

Joseph Staudinger, "DDR Volterra Series Behavioral Model with Fading Memory and Dynamics for High Power Infrastructure Amplifiers," Published in: 2011 IEEE Topical Conference on Power Amplifiers for Wireless and Radio Applications (PAWR), pp. 61-64, Date of Conference: Jan. 16-19, 2011, Phoenix, AZ, USA, consisting of 4-pages.

P. Saad etal., "Concurrent Dual-Band GaN-HEMT Power Amplifier at 1.8 GHz and 2.4 GHz," Published in: 2012 IEEE 13th Annual Wireless and Microwave Technology Conference (WAMICON), pp. 1-5, Date of Conference: Apr. 15-17, 2012, Cocoa Beach, FL, USA, consisting of 5-pages.

J. Moon etal., "A Multimode/Multiband Envelope Tracking Transmitter With Broadband Saturated Amplifier," Published in: 2011 IEEE MTT-S International Microwave Symposium Digest, (MTT), pp. 1-4, Date of Conference: Jun. 5-10, 2011, Baltimore, MD, USA, consisting of 4-pages.

S.A. Bassam etal., "2-D Digital Predistortion (2-D-DPD) Architecture for Concurrent Dual-Band Transmitters," Published in: IEEE Transactions on Microwave Theory and Techniques, vol. 59(10):2547-2553, Date of Publication: Sep. 1, 2011, consisting of 7-pages.

W. Chen etal., "Design and Linearization of Concurrent Dual-Band Doherty Power Amplifier With Frequency-Dependent Power Ranges," Published in: IEEE Transactions on Microwave Theory and Techniques, vol. 59(10):2537-2546, Date of Publication: Sep. 5, 2011, consisting of 10-pages.

D. Kang etal. "Design of Bandwidth-Enhanced Doherty Power Amplifiers for Handset Applications," Published in: IEEE Transactions on Microwave Theory and Techniques, vol. 59(12):3474-3483, Date of Publication: Nov. 3, 2011, consisting of 10-pages.

J. Moon etal., "A Multimode/Multiband Envelope Tracking Transmitter With Broadband Saturated Amplifier," Published in: IEEE Transactions on Microwave Theory and Techniques, vol. 59(12):3463-3473, Date of Publication: Nov. 4, 2011, consisting of 11-pages.

C.A.R. Fernandes etal., "Analysis and Power Diversity-Based Cancellation of Nonlinear Distortions in OFDM Systems," Published in: IEEE Transactions on Signal Processing, vol. 60(7):3520-3531, Date of Publication: Apr. 5, 2012, consisting of 12-pages.

S.A. Bassam etal., "Subsampling Feedback Loop Applicable to Concurrent Dual-Band Linearization Architecture," Published in: IEEE Transactions on Microwave Theory and Techniques, vol. 60(6):1990-1999, Date of Publication: Apr. 24, 2012, consisting of 10-pages.

J. Kim etal., "A New Architecture for Frequency-Selective Digital Predistortion Linearization for RF Power Amplifiers," Published in: 2012 IEEE MTT-S International Microwave Symposium Digest, (MTT), pp. 1-3, Date of Conference: Jun. 17-22, 2012, Montreal, QC, CA, consisting of 3-pages.

L. Ding etal., "Concurrent Dual-band Digital Predistortion," Published in: 2012 IEEE MTT-S International Microwave Symposium Digest, (MTT), pp. 1-3, Date of Conference: Jun. 17-22, 2012, Montreal, QC, CA, consisting of 3-pages.

C. Baylis and R.J. Marks, "Small Perturbation Harmonic Coupling in Nonlinear Periodicity Preservation Circuits," Published in: IEEE Transactions on Circuits and Systems I: Regular Papers, vol. 59(12):3034-3045, Date of Publication Jul. 25, 2012, consisting of 12-pages.

Y. Liu etal., "Modified Least Squares Extraction for Volterra-Series Digital Predistorter in the Presence of Feedback Measurement Errors," Published in: IEEE Transactions on Microwave Theory and Techniques, vol. 60 (11):3559-3570, Publication Date: Sep. 7, 2012, consisting of 12-pages.

International Search Report and Written Opinion dated Sep. 15, 2014 in International Application Serial No. PCT/IB2014/061476, International Filing Date—May 15, 2014 consisting of pages 13-pages.

Bassam et al., "Linearization of Concurrent Dual-Band Power Amplifier Based on 2D-DPD Technique" Published Oct. 18, 2011 in IEEE Microwave and Wireless Components Letters, vol. 21(12):685-687 consisting of 4-pages.

(56) References Cited

OTHER PUBLICATIONS

Mkadem et al., "Wiener G-Functionals for Nonlinear Power Amplifier Digital Predistortion" presented at 2012 IEEE MTT-S International Conference. Montreal, QC, Canada, Published in Microwave Symposium Digest (MTT), pp. 1-3, Jun. 17-22, 2012 consisting of pages 3-pages.
Mohamed et al., "Reconfigurable Doherty Power Amplifier for Multifrequency Wireless Radio Systems" Published Mar. 8, 2013 in: IEEE Transactions on Microwave Theory and Techniques, vol. 61(4):1588-1598 consisting of consisting of 12-pages.
Ghannouchi et al, "Distortion and Impairments Mitigation and Compensation of Single-and Multi-band Wireless Transmitters (Invited)" Published May 15, 2013 in: IET Microwaves, Antennas & Propagation, vol. 7(7):518-534 consisting of 18-pages.
David Yu-Ting. Wu and Slim Boumaiza, "A Modified Doherty Configuration for Broadband Amplification Using Symmetrical Devices," Published in: IEEE Transactions on Microwave Theory and Techniques, vol. 60 (10):3201-3213, Publication Date: Oct. 2012, consisting of 13-pages.
A.M. Mahmoud Mohamed etal., "Reconfigurable Doherty Power Amplifier for Multifrequency Wireless Radio Systems," Published in: IEEE Transactions on Microwave Theory and Techniques, vol. 61(4):1588-1598, Date of Publication: Mar. 8, 2013, consisting of 11-pages.
C. Quindroit etal., "Concurrent Dual-Band Digital Predistortion for Power Amplifier Based on Orthogonal Polynomials," Published in: 2013 IEEE MTT-S International Microwave Symposium Digest, (IMS), pp. 1-4, Date of Conference: Jun. 2-7, 2013, Seattle, WA, USA, consisting of 4-pages.
G.Yang etal., "2D Orthogonal Polynomials for Concurrent Dual-Band Digital Predistortion," Published in: 2013 IEEE MTT-S International Microwave Symposium Digest, (IMS), pp. 1-3, Date of Conference: Jun. 2-7, 2013, Seattle, WA, USA, consisting of 3-pages.
H. Golestaneh etal., "An Extended-Bandwidth Three-Way Doherty Power Amplifier," Published in: IEEE Transactions on Microwave Theory and Techniques, vol. 61(9):3318-3328, Date of Publication: Aug. 8, 2013, consisting of 11-pages.
A.M. Mahmoud Mohamed etal., "Electronically Tunable Doherty Power Amplifier for Multi-Mode Multi-Band Base Stations;" Published in: IEEE Transactions on Circuits and Systems I: Regular Papers, vol. 61(4):1229-1240, Date of Publication Oct. 21, 2013, consisting of 12-pages.
A.M. Mahmoud Mohamed etal., "Doherty Power Amplifier With Enhanced Efficiency at Extended Operating Average Power Levels," Published in: IEEE Transactions on Microwave Theory and Techniques, vol. 61(12):4179-4187, Date of Publication: Nov. 8, 2013, consisting of 9-pages.
B. Fehri and S. Boumaiza, "Baseband Equivalent Volterra Series for Digital Predistortion of Dual-Band Power Amplifiers," Published in: IEEE Transactions on Microwave Theory and Techniques, vol. 62(3):700-714, Publication Date: Feb. 17, 2014, consisting of 15-pages.
B. Fehri and S. Boumaiza, "Baseband Equivalent Volterra Series for Behavioral Modeling and Digital Predistortion of Power Amplifiers Driven With Wideband Carrier Aggregated Signals," Published in: IEEE Transactions on Microwave Theory and Techniques, vol. 62(11):2594-2603, Publication Date: Oct. 7, 2014, consisting of 10-pages.
Final Rejection Office Action dated Jan. 11, 2017, in U.S. Appl. No. 14/888,876, filed Nov. 3, 2015 (12-pages).
International Search Report and Written Opinion dated Sep. 15, 2014 for International Application Serial No. PCT/IB2014/061477, International Filing Date—May 15, 2014 consisting of pages 14-pages.
First Office Action dated Aug. 8, 2016, in U.S. Appl. No. 14/888,876, filed Nov. 3, 2015 (30-pages).

* cited by examiner (Case 1; Band 2)

(Case 2; Band 1)

(Case 2; Band 2)

(Case 3; Band 1)

(Case 3; Band 2)

BASEBAND EQUIVALENT VOLTERRA SERIES FOR DIGITAL PREDISTORTION IN MULTI-BAND POWER AMPLIFIERS

TECHNICAL FIELD

The present invention relates to amplifiers and transmitters, and in particular to a method and system for digital pre-distortion in multi-band power amplifiers and transmitters.

BACKGROUND

Advanced modulation techniques and access technologies are enabling high speed mobile access for users. However, these techniques are increasing the complexity of the development of radio transceivers. The continued quest for flexible and dynamic networks challenges designers to develop novel radio systems capable of processing multi-band and frequency aggregated multi-standard, multi-carrier communication signals. While radio systems designers could use multiple power amplifiers (PA) 10, 12, each one dedicated to a particular radio frequency (RF) band, as shown in FIG. 1, this solution dramatically increases the deployment cost of the network and limits network flexibility. Alternatively, a more suitable solution for future communication systems is the use of a unique multi-band PA 14 to amplify combined multi-band multi-carrier and multi-standard signals, as shown in FIG. 2. This would incur lower costs for materials and more flexibility in deployment. However, this solution imposes new efficiency and linearity challenges. In fact, a single multi-band PA should provide RF performance (efficiency, gain, output power) comparable to multiple single-band PA modules. In addition, when concurrently driven with multiple signals scattered over spaced frequencies, a multi-band PA can actually aggravate the distortion problems encountered.

Previous efforts to improve the efficiency and linearity of single-band PAs, such as load (Doherty) and drain-supply (envelope tracking) modulations, have been applied to improve efficiency at the back-off region of single-band PAs. Recent studies identified sources of bandwidth limitations and devised solutions to mitigate them. Several proof-of-concept prototypes have demonstrated excellent efficiency in the back-off region over a wide range of frequencies.

On the other hand, linearization techniques, such as Digital Pre-distortion (DPD), have been applied to extend the linear region of single-band PAs. A number of DPD schemes have been developed which have demonstrated excellent linearization capability. These schemes evolved from low complexity schemes (e.g., memory-less polynomials, Hammerstein and Wiener models, memory polynomials) to more comprehensive ones (e.g., Volterra series and Artificial Neural Networks (ANN)).

In the case of the Volterra series, its application to the linearization of single-band PAs which exhibit significant memory effects was conditional on its successful pruning. This motivated researchers investigating multi-band DPD schemes to discard the Volterra series option, worrying it would lead to unmanageable and impractical solutions. Hence, most of the recent work has concentrated on efforts to generalize the previously mentioned low complexity schemes to the dual-band PA context.

A dual-band signal can be expressed as follows:

$$x(t) = x_1(t) + x_2(t) \qquad (1)$$
$$= \text{Re}(\tilde{x}_1(t)e^{j\omega_1 t} + \tilde{x}_2(t)e^{j\omega_2 t}),$$

where x(t) is the combined dual-band dual-standard signal, $x_1(t)$ and $x_2(t)$ are single-band multicarrier signals modulated around the angular frequencies $\omega_1$ and $\omega_2$, respectively, and $\tilde{x}_1(t)$ $\tilde{x}_2(t)$ denote the baseband envelops of $x_1(t)$ and $x_2(t)$, respectively.

The dual-band input signal can be represented as a broadband signal with an angular carrier frequency equal to $(\omega_1+\omega_2)/2$ as given by:

$$x(t) = x_1(t) + x_2(t) \qquad (2)$$
$$= \text{Re}\left(\left(\tilde{x}_1(t)e^{j\frac{\omega_1-\omega_2}{2}t} + \tilde{x}_2(t)e^{j\frac{\omega_2-\omega_1}{2}t}\right)e^{j\frac{\omega_1+\omega_2}{2}t}\right)$$
$$= \text{Re}(\tilde{x}(t) \cdot e^{j\frac{\omega_1+\omega_2}{2}t}),$$

where $\tilde{x}(t)$ is the baseband envelope of the combined signal. When the dual-band signal is amplified by a PA, the passband component of the output signal, $y_{pb}(t)$, can be described as:

$$y_{pb}(t) = y_1(t) + y_2(t) \qquad (3)$$
$$= \text{Re}\left(\left(\tilde{y}_1(t)e^{j\frac{\omega_1-\omega_2}{2}t} + \tilde{y}_2(t)e^{j\frac{\omega_2-\omega_1}{2}t}\right) \cdot e^{j\frac{\omega_1+\omega_2}{2}t}\right)$$
$$= \text{Re}(\tilde{y}_{pb}(t) \cdot e^{j\frac{\omega_1+\omega_2}{2}t}),$$

where $y_1(t)$ and $y_2(t)$ are multicarrier output signals modulated around the angular frequencies $\omega_1$ and $\omega_2$ respectively, and $\tilde{y}_1(t)$ $\tilde{y}_2(t)$ denote the baseband envelopes of $y_1(t)$ and $y_2(t)$, respectively.

In the classical PA behavioral modeling approach, the PA behavior is modeled as a single-input single-output (SISO) system where the PA output $\tilde{y}_{pb}(t)$ is a function of the PA input $\tilde{x}(t)$, as given in (4):

$$\tilde{y}_{pb}(t) = \tilde{f}(\tilde{x}(t)) \qquad (4)$$

where $\tilde{f}$ is the SISO describing function of the PA 16, as shown in FIG. 3. Note that the output shown in FIG. 3 is idealized. Digitization of the SISO model requires sampling both $\tilde{x}(t)$ and $\tilde{y}_{pb}(t)$ at a high frequency rate as follows:

$$f_{s,SiSo} \geq \left(S + 5 \cdot \max\left(\frac{B_1}{2}, \frac{B_2}{2}\right)\right),$$

where $B_1$ and $B_2$ represent the bandwidths of $\tilde{x}_1(t)$ and $\tilde{x}_2(t)$, respectively, and S denotes the frequency spacing between the two signals $$\left(\text{i.e.}, = f_2 - f_1 = \frac{\omega_2 - \omega_1}{2\pi}\right),$$

and where $f_1$ and $f_2$ are the two bands' carrier frequencies, respectively. The factor of 5 represents the spectrum regrowth due to PA nonlinearity which is assumed equal to 5.

Alternatively, a dual-input dual-output (DIDO) approach would require a significantly lower sampling rate. In such a formulation, the PA output in each band (i.e.,$\tilde{y}_1(t)$ and $\tilde{y}_2(t)$, is expressed separately as a function of the two input signals' envelopes $\tilde{x}_1(t)$ and $\tilde{x}_2(t)$, as given by:

$$\tilde{y}_1(t) = \tilde{f}_1(\tilde{x}_1(t), \tilde{x}_2(t))$$

$$\tilde{y}_2(t) = \tilde{f}_2(\tilde{x}_1(t), \tilde{x}_2(t)) \qquad (5)$$

where $\tilde{f}_1$ and $\tilde{f}_2$ form the PA's 18 dual-band describing functions, as shown in FIG. 4. Note that the output shown in FIG. 4 is idealized. Actual output depends on the success of the pre-distortion approach employed. The construction of the two describing functions, $\tilde{g}_1$ and $\tilde{g}_2$, needed to model and/or to linearize the dual-band PA, is performed in the digital domain This requires the sampling of $\tilde{x}_1(t)$, $\tilde{x}_2(t)$, $\tilde{y}_1(t)$ and $\tilde{y}_2(t)$ at a frequency rate given by $$f_{s,DiDo} \geq (5 \cdot \max(B_1, B_2))$$

This sampling rate is independent of the frequency separation, S, which may be very large. Hence, $f_{s,DiDo}$ is significantly lower than $f_{s,SiSo}$. For example, if we assume a dual-band signal composed of a 15 MHz WCDMA signal around 2.1 GHz and a 10 MHz LTE one centered at 2.4 GHz, the theoretical sampling frequency needed for the dual-band model, $f_{s,DiDo}$, has to be at least equal to 75 MHz; significantly lower than the 675 MHz sampling frequency required for the SISO model. The ratio between the two sampling frequencies is equal to $$\frac{f_{s,SiSo}}{f_{s,DiDo}} = 0.11.$$

There have been several attempts to devise describing functions in order to implement a dual-band model as given in equation (5). Some have proposed a third order frequency selective pre-distortion technique to handle each band separately in order to model and/or linearize PAs exhibiting strong "differential" memory effects (i.e., high imbalance between the upper and lower in-band and inter-band distortion components). This technique was tested using a multi-carrier 1001 WCDMA signal and extended to address the $5^{th}$ order inter-modulation distortions of a PA driven with multi-tone signals. Although this technique was applied to multi-carrier single-band signals, it can be generalized to the dual-band case provided the required sampling rate is reduced to cope with large frequency spacing.

Some have proposed an IF dual-band model implementing a Weiner-Hammerstein DPD scheme using a sub-sampling feedback path. Although the reported simulation results showed 10 dB spectrum regrowth reduction, the proposed architecture involved digital to analog conversion (DAC) and analog to digital conversion (ADC) with disproportionate sampling rates and complicated IF processing. Furthermore, starting with a $5^{th}$ order memoryless model driven with a dual-band signal, some have shown that the PA's output in each band depends on both PA input signals. This observation has been generalized to the memory polynomial model to yield a two dimension DPD (2D-DPD) model. Reported linearization results demonstrated a 12 dB improvement of the adjacent channel leakage ratio (ACLR) at the cost of a large number of coefficients. However, stability issues were reported.

Some have proposed an orthogonal representation to handle the ill-conditioning problem and numerical instability of the 2D-DPD model. Alternatively, some have proposed 2D Hammerstein and 2D Weiner models to address the large number of coefficients required by the 2D-DPD model. When applied to construct a behavioral model of a dual-band PA with a nonlinearity order equal to 5 and a memory depth equal to 5, the 2D Hammerstein and 2D Weiner models needed 40 coefficients in each band as opposed to the 2D-DPD which required 150 coefficients. However, while the 2D-DPD model has been validated as a dual-band digital pre-distorter, the application of the 2D Hammerstein and 2D Weiner models to the linearization of dual PAs is problematic and only behavioral modeling results have been reported.

Some have pointed out the implementation complexity of the 2D-DPD and have suggested a two dimensional look up table (LUT)-based representation as an alternative. This latter approach was further simplified to use single dimension LUTs. When applied to the linearization of a dual-band PA driven with dual-band signals (separated by 97 MHz), the model demonstrated an ACLR of about −45 dB, which barely passes the mask. However, the proposed DPD scheme was operated with a sampling rate equal to 153.6 MHz and consequently a large oversampling rate with a 10 MHz signal. Hardware to achieve such a large oversampling rate is costly and undesirable.

Known behavior modeling and linearization approaches have been restricted to generalizing low complexity schemes for single-band PAs. Volterra series have been avoided due to the perceived unmanageable number of coefficients and consequent complexity.

SUMMARY

Methods, systems and apparatus for modelling a power amplifier and pre-distorter fed by a multi-band signal are disclosed. According to one aspect, a method includes receiving a multi-band signal and generating a discrete base band equivalent, BBE, Volterra series based on the received multi-band signal, where the series has distortion products grouped according to determined shared kernels. The shared kernels are determined based on a transformation of a real-valued continuous-time pass band Volterra series without pruning of kernels.

According to this aspect, in some embodiments, the shared kernels are determined based on the transformation of the real-valued continuous-time pass band Volterra series by steps that include transforming the real-valued continuous time pass band Volterra series to a multi-frequency complex-valued envelope series. The multi-frequency complex-valued envelope signal is transformed to a continuous-time pass band-only series, which is then transformed to a continuous-time baseband equivalent series. The continuous-time baseband equivalent signal is discretized to produce the discrete base band equivalent Volterra series. Shared kernels are identify, each shared kernel having distortion products in common with another shared kernel. In some embodiments, transforming the continuous-time pass band-only signal to a continuous-time baseband equivalent signal includes expressing the continuous-time pass band-only series in convolution form. The Laplace transform is applied to the convolution form to produce a Laplace domain expression, which is frequency shifted to baseband to produce a baseband equivalent expression in the Laplace domain The inverse Laplace transform is applied to the baseband equivalent expression to produce the continuous-time baseband equivalent series. In some embodiments, a number of terms in the Laplace domain expression are reduced via symmetry. In some embodiments, terms of the Laplace domain expression are grouped based on frequency intervals where distortion terms are not zero. In some embodiments, discretizing the continuous-time baseband equivalent series to produce the discrete base band equivalent Volterra series includes truncating the continuous-time baseband equivalent series to a finite non-linearity order, and expressing the truncated series as summations of non-linear distortion terms, with upper limits of the summations being memory depths assigned to each order of the non-linear distortion terms. In some embodiments, a distortion term is a group of distortion products multiplied by a shared kernel.

According to another aspect, embodiments include a digital pre-distorter (DPD) system. The system includes a Volterra series DPD modelling unit. The DPD modelling unit is configured to calculate a discrete base band equivalent, BBE, Volterra series. The series has distortion products grouped according to determined shared kernels. The shared kernels are determined based on a transformation of a real-valued continuous-time pass band Volterra series without pruning of kernels.

According to this aspect, the DPD may further comprise a power amplifier configured to produce an output in response to a multi-band input. The output of the power amplifier is provided to the Volterra series DPD modelling unit to enable the Volterra series DPD modeling unit to compute the shared kernels based on the output of the power amplifier. In some embodiments, the DPD system further comprises a transmitter observation receiver configured to sample the output of the power amplifier and provide the sampled output to the Volterra series DPD modelling unit. In some embodiments, the distortion products and their associated kernels are determined by transforming the real-valued continuous time pass band Volterra series to a discrete base band equivalent Volterra series according to a series of steps that include: transforming the real-valued continuous time pass band Volterra series to a multi-frequency complex-valued envelope series; transforming the multi-frequency complex-valued envelope signal to a continuous-time pass band-only series; transforming the continuous-time pass band-only signal to a continuous-time baseband equivalent series; discretizing the continuous-time baseband equivalent signal to produce the discrete base band equivalent Volterra series. The shared kernels are identified such that each shared kernel has distortion products in common with another shared kernel. In some embodiments, transforming the continuous-time pass band-only signal to a continuous-time baseband equivalent signal includes the following steps: expressing the continuous-time pass band-only series in convolution form; applying a Laplace transform to the convolution form to produce a Laplace domain expression; frequency shifting the Laplace domain expression to baseband to produce a baseband equivalent expression in the Laplace domain; and applying an inverse Laplace transform to the baseband equivalent expression to produce the continuous-time baseband equivalent series. In some embodiments, a number of terms in the Laplace domain expression are reduced via symmetry. In some embodiments, transforming the continuous-time pass band-only signal to a continuous-time baseband equivalent signal further includes grouping terms of the Laplace domain expression based on frequency intervals where distortion terms are not zero. In some embodiments, discretizing the continuous-time baseband equivalent series to produce the discrete base band equivalent Volterra series includes: truncating the continuous-time baseband equivalent series to a finite non-linearity order; and expressing the truncated series as summations of non-linear distortion terms, with upper limits of the summations being memory depths assigned to each order of the non-linear distortion terms. In some embodiments, a distortion term is a group of distortion products multiplied by a shared kernel.

According to another aspect, embodiments include a Volterra series digital pre-distorter, DPD, modelling unit. The DPD modelling unit includes a memory module configured to store terms of a discrete base band equivalent, BBE, Volterra series. Also, a grouping module is configured to group distortion products of the series according to determined shared kernels. The DPD modelling unit also includes a shared kernel determiner configured to determine the shared kernels based on a transformation of a real-valued continuous-time pass band Volterra series without pruning of kernels. Also, a series term calculator is configured to calculate the terms of the discrete base band equivalent Volterra series, the terms being the distortion products multiplied by their respective shared kernels.

According to this aspect, in some embodiments, the BBE Volterra series terms are based on a multi-band input. In some embodiments, the multi-band input is a dual band input. In some embodiments, the shared kernel determiner is further configured to determine the shared kernels via a least squares estimate based on the multi-band input and an output of a power amplifier. In some embodiments, the kernels and distortion products are derived from the real-valued continuous-time pass band Volterra series by: transforming the real-valued continuous time pass band Volterra series to a multi-frequency complex-valued envelope series; transforming the multi-frequency complex-valued envelope signal to a continuous-time pass band-only series; transforming the continuous-time pass band-only signal to a continuous-time baseband equivalent series; discretizing the continuous-time baseband equivalent signal to produce the discrete base band equivalent Volterra series; and identifying the shared kernels, each shared kernel having distortion products in common

DETAILED DESCRIPTION

Figure 1:
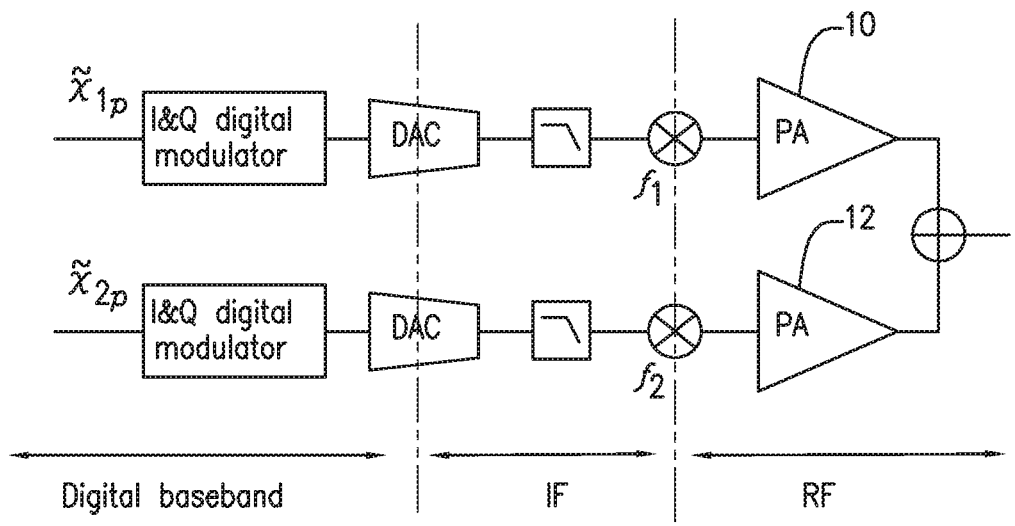
FIG. 1 is a block diagram of a known power amplification architecture using a separate power amplifier per input signal.
Figure 2:
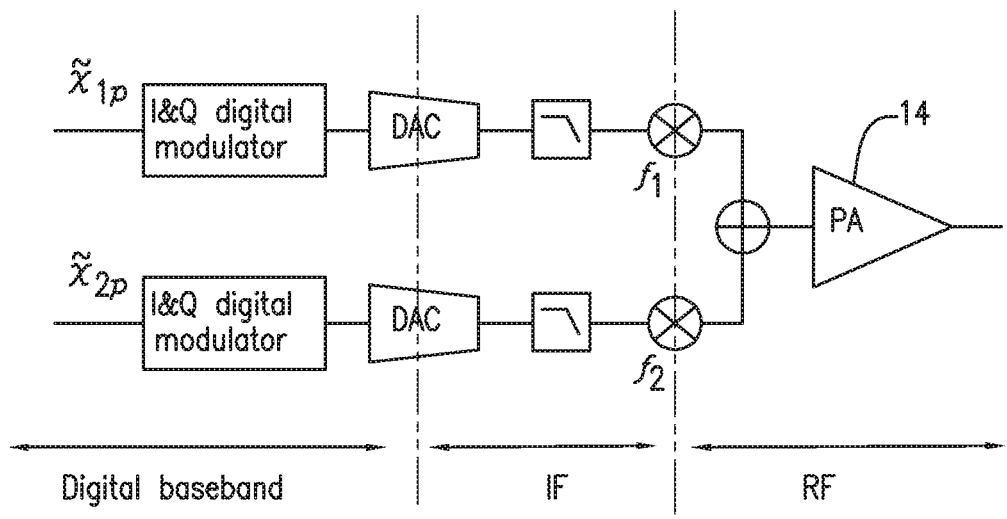
FIG. 2 is a block diagram of a known power amplification architecture using a single power amplifier.
Figure 3:
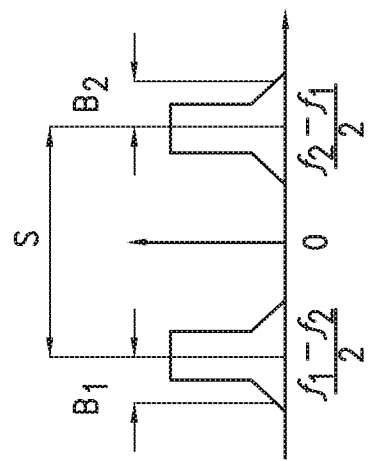
FIG. 3 is an idealized signal input/output diagram for a known single input/single output system.
Figure 3:
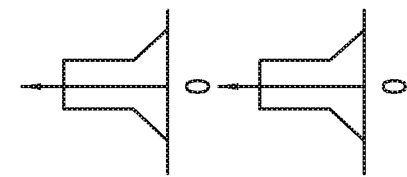
Figure 3:
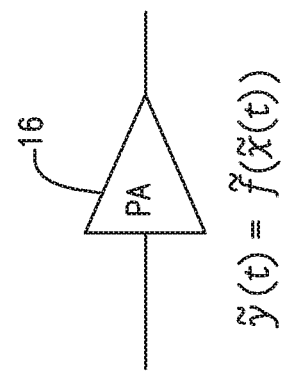
Figure 4:
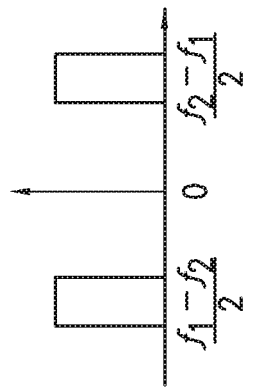
FIG. 4 is an idealized signal input/output diagram for a known dual input/dual output system.
Figure 4:
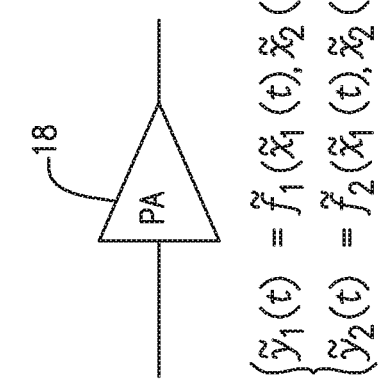

Before describing in detail exemplary embodiments that are in accordance with the present invention, it is noted that the embodiments reside primarily in combinations of apparatus components and processing steps related to digital pre-distortion of wideband power amplifiers fed by a multi-band signal. Accordingly, the system and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

The Volterra series is an appropriate modeling framework for dual-band PAs which are recursive nonlinear dynamic systems with fading memory. The empirically pruned LPE Volterra series has been successfully applied to model and to linearize single-band PAs. However, application of a Volterra series to model and linearize a multi-band PA without pruning and having a manageable number of terms has not been presented. In some embodiments described herein, a BBE dual-band Volterra series formulation is derived from the original passband real-valued Volterra series to model and linearize dual-band PAs. This approach advantageously does not require pruning and the derivation set forth below is particularly attentive to addressing exponential growth in the number of coefficients experienced with the LPE approach. Thus, the present arrangement provides a method and system for modelling a power amplifier fed by a multi-band signal input. Methods described herein present a formulation of pre-distortion that transforms a continuous-time real valued Volterra series to a discrete base band equivalent Volterra series that has a reduced number of terms and is achieved without pruning. Steps for deriving the model are described below.

Step 1: Continuous-time real-valued Volterra series modeling: The Volterra series framework is initially used to describe the relationship between the real pass-band signals at the system input and output:

$$y(t) = \Sigma_{p=1}^{NL} \int_{-\infty}^{\infty} \cdots \int_{-\infty}^{\infty} h_p(\tau_1, \ldots, \tau_p) \Pi_{j=1}^{p} x(t-\tau_j) d\tau_j \quad (6)$$

where x(t) and y(t) represent the PA input and output RF signals and NL is the nonlinearity order.

Step 2: Real-valued to complex-valued envelope signal transformation: In the case of a dual-band PA, the band-limited input signal x(t) can be expressed as:

$$x(t) = \mathrm{Re}\{\tilde{x}_1(t)e^{j\omega_1 t} + \tilde{x}_2(t)e^{j\omega_2 t}\} = \frac{1}{2}(\tilde{x}_1^*(t)e^{-j\omega_1 t} + \tilde{x}_1(t)e^{j\omega_1 t}) + \quad (7)$$

$$\frac{1}{2}(\tilde{x}_2^*(t)e^{-j\omega_2 t} + \tilde{x}_{2(t)}e^{j\omega_2 t}) \quad (8)$$

where $\tilde{x}_1(t)$ and $\tilde{x}_2(t)$ represent the two complex baseband envelope signals that modulate the two different angular frequencies, $\omega_1$ and $\omega_2$. Substituting (8) into (7) yields an expression relating the output signal y(t) to $\tilde{x}_1(t)$, $\tilde{x}_2(t)$, $\omega_1$ to $\omega_2$ as follows:

$$y(t) = f(\tilde{x}_1(t), \tilde{x}_2(t), e^{\pm jp\omega_1 t}, e^{\pm jq\omega_2 t}); (p,q) \in \{1, \ldots NL\}^2 \quad (9)$$

where the describing function $f$ is used to represent the real valued Volterra series (7). Since the output signal y(t) in (9) is a result of the application of a nonlinear function to a band-limited RF signal, it contains several spectrum components that involve multiple envelopes, $\tilde{y}_{p,q}(t)$, which modulate the mixing products, $p\omega_1 \pm q\omega_2$, of $\omega_1$ and $\omega_2$ as shown in (10):

$$y(t) = \sum_{p,q=NL-NL}^{p+q=NL} \frac{1}{2}(\tilde{y}_{p,q}^*(t) \cdot e^{-j(p\omega_1+q\omega_2)t} + \tilde{y}_{p,q}(t) \cdot e^{j(p\omega_1+q\omega_2)t}) = \quad (10)$$

$$\frac{1}{2}(\tilde{y}_{0,0}^*(t) \cdot e^{-0jt} + \tilde{y}_{0,0}(t) \cdot e^{0jt}) + \frac{1}{2}(\tilde{y}_{1,0}^*(t) \cdot e^{-j\omega_1 t} +$$

$$\frac{1}{2}(\tilde{y}_{1,0}^*(t) \cdot e^{-j\omega_1 t} + \tilde{y}_{1,0}(t)e^{j\omega_1 t}) +$$

$$\frac{1}{2}(\tilde{y}_{0,1}^*(t) \cdot e^{-j\omega_2 t} + \tilde{y}_{0,1}(t)e^{j\omega_2 t}) +$$

$$\frac{1}{2}(\tilde{y}_{2,-1}^*(t) \cdot e^{-j(2\omega_1-\omega_2)t} + \tilde{y}_{2,-1}(t)e^{j(2\omega_1-\omega_2)t}) +$$

$$\frac{1}{2}(\tilde{y}_{-1,2}^*(t) \cdot e^{-j(2\omega_2-\omega_1)t} + \tilde{y}_{-1,2}(t)e^{j(2\omega_2-\omega_1)t})$$

$$\vdots$$

$$+\frac{1}{2}(\tilde{y}_{NL,0}^*(t) \cdot e^{-NLj\omega_1 t} + \tilde{y}_{NL,0}(t)e^{NLj\omega_1 t}) +$$

$$\frac{1}{2}(\tilde{y}_{0,NL}^*(t) \cdot e^{-NLj\omega_2 t} + \tilde{y}_{0,NL}(t)e^{NLj\omega_2 t})$$

Here, ỹ_0,0(t) denotes the envelope at DC, ỹ_1,0(t) and ỹ_0,1(t) denote the envelopes of the first order in-band signals, and ỹ_(2, −1)(t) and ỹ_(−1,2)(t), denote the envelopes of the third order inter-band signals. Finally, ỹ_(0,NL)(t) and ỹ_(NL,0)(t), represent the first and second NLth harmonics, respectively.

Step 3: Multi frequency to passband only transformation: Equating the terms on the right sides of (9) and (10) that share the same frequency range (fundamental, mixing products) yields a multi-frequency model consisting of several distinct equations that relate the output envelopes $\tilde{y}_{p,q}(t)$ to $\tilde{x}_1(t)$, $\tilde{x}_2(t)$, $\omega_1$ and $\omega_2$. Since we are mainly interested in the relationship between the envelopes of the output and input signals around the two carriers' frequencies, only the passband components of the PA output are considered in the equation below:

$$y_{pb}(t) = \tag{11}$$
$$\frac{1}{2}\left(\tilde{y}^*_{\omega_1}(t)\cdot e^{-j\omega_1 t}+\tilde{y}_{\omega_1}(t)e^{j\omega_1 t}\right)+\frac{1}{2}\left(\tilde{y}^*_{\omega_2}(t)\cdot e^{-j\omega_2 t}+\tilde{y}_{\omega_2}(t)e^{j\omega_2 t}\right)=$$
$$\frac{1}{2}\left(y^*_{\omega_1}(t)\right)+\frac{1}{2}\left(y^*_{\omega_2}(t)+y_{\omega_2}(t)\right)$$

where $y_{\omega_1}(t)=\tilde{y}_{\omega_1}(t)e^{j\omega_1 t}$ and $y_{\omega_2}(t)=\tilde{y}_{\omega_2}(t)e^{j\omega_2 t}$ Additional derivations are applied to produce the detailed expression for the first term in (11), $y_{\omega_1}(t)$, around the first frequency Similar derivations can be used to produce the expression of the second frequency term, $y_{\omega_2}(t)$, which can be modeled as a summation of the Volterra series nonlinear terms $y_{\omega_1,2k+1}(t)$ of order $2k+1$. The term can also be expressed as a function of the envelopes of the nonlinear terms, $y_{\omega_1,2k+1}(t)$, denoted hereafter $\tilde{y}_{\omega_1,2k+1}(t)$ and the angular frequency $\omega_1$ as follows:

$$y_{\omega_1}(t)=\sum_{k=0}^{\infty}y_{\omega_1,2k+1}(t)=\left(\sum_{k=0}^{\infty}\tilde{y}_{\omega_1,2k+1}(t)\right)\cdot e^{j\omega_1 t} \tag{12}$$

It is worth noting that only odd powered terms are retained and even terms are discarded since they do not appear in the pass band response. Equating the terms on the right sides of expanded (9) and (12) yields a continuous BBE DIDO Volterra series that expresses $y_{\omega_1,2k+1}(t)$ as functions of $\tilde{x}(t)$, and $\omega_1$. Below is the expression for $y_{\omega_1,1}(t)$ and $y_{\omega_1,3}(t)$.

$$y_{\omega_1,1}(t)=\int_{-\infty}^{\infty}h_1(\tau_1)\cdot\tilde{x}_1(t-\tau_1)e^{j\omega_1(t-\tau_1)}\cdot d\tau_1 \tag{13}$$

$$y_{\omega_1,3}(t)=\int_{-\infty}^{\infty}\int_{-\infty}^{\infty}\int_{-\infty}^{\infty}h_3(\tau_1,\tau_2,\tau_3)\cdot(\tilde{x}_1(t-\tau_1)e^{j\omega_1(t-\tau_1)})$$
$$(\tilde{x}_1(t-\tau_2)e^{j\omega_1(t-\tau_2)})(\tilde{x}(t-\tau_3)e^{j\omega_1(t-\tau_2)})^*+$$
$$(\tilde{x}_1(t-\tau_1)e^{j\omega_1(t-\tau_1)})^*(\tilde{x}_1(t-\tau_2)e^{j\omega_1(t-\tau_2)})(\tilde{x}_1(t-\tau_3)e^{j\omega_1(t-\tau_3)})+$$
$$(\tilde{x}_1(t-\tau_1)e^{j\omega_1(t-\tau_1)})(\tilde{x}_1(t-\tau_2)e^{j\omega_1(t-\tau_2)})(\tilde{x}_1(t-\tau_3)e^{j\omega_2(t-\tau_3)})^*+$$
$$(\tilde{x}_1(t-\tau_1)e^{j\omega_1(t-\tau_1)})(\tilde{x}_2(t-\tau_2)e^{j\omega_2(t-\tau_2)})^*+$$
$$(\tilde{x}_1(t-\tau_1)e^{j\omega_1(t-\tau_1)})(\tilde{x}_2(t-\tau_2)e^{j\omega_2(t-\tau_2)})^*(\tilde{x}_2(t-\tau_3)e^{j\omega_2(t-\tau_3)})+$$
$$(\tilde{x}_2(t-\tau_1)e^{j\omega_2(t-\tau_1)})^*(\tilde{x}_1(t-\tau_2)e^{j\omega_1(t-\tau_2)})(\tilde{x}_2(t-\tau_3)e^{j\omega_2(t-\tau_3)})+$$
$$(\tilde{x}_2(t-\tau_1)e^{j\omega_2(t-\tau_1)})(\tilde{x}_1(t-\tau_2)e^{j\omega_1(t-\tau_2)})(\tilde{x}_2(t-\tau_3)e^{j\omega_2(t-\tau_3)})^*+$$
$$(\tilde{x}_2(t-\tau_1)e^{j\omega_2(t-\tau_1)})(\tilde{x}_2(t-\tau_2)e^{j\omega_2(t-\tau_2)})^*(\tilde{x}_1(t-\tau_3)e^{j\omega_1(t-\tau_3)})+$$
$$(\tilde{x}_2(t-\tau_1)e^{j\omega_2(t-\tau_1)})^*(\tilde{x}_2(t-\tau_2)e^{j\omega_2(t-\tau_2)})(\tilde{x}_1(t-\tau_3)e^{j\omega_1(t-\tau_3)})$$
$$\}\cdot d\tau_3 d\tau_2 d\tau_1 \tag{14}$$

Step 4: Continuous-time Passband to baseband equivalent transformation: In order to be implementable in a digital processor with manageable complexity, a pass band model should be transformed into a baseband equivalent model. Such a model enables mimicking the RF nonlinear dynamic distortion while applying all the computations in baseband at a low sampling rate. The baseband equivalent model is obtained by frequency translating the pass band Volterra series model to baseband. For that purpose, the continuous time pass band Volterra series expressions of (13) and (14) are first rewritten in convolution form. The convolution form for) $y_{\omega_1,1}(t)$ is given by:

$$y_{\omega_1,1}(t)=h_1(t)*(\tilde{x}_1(t)e^{j\omega_1 t}) \tag{15}$$

As the kernel $h_3$ is tri-variate, $h_3(\tau_1,\tau_2,\tau_3)$, and the output $y(t)$ is mono-variate, the output function is re-assigned as follows: $y_{\omega_1,3}(t)=y_{\omega_1,3}(t_1,t_2,t_3)|_{t_1=t_2=t_3=t}\triangleq y_{\omega_1,3}(t,t,t)$. The convolution form is given below.

$$y_{\omega_1,3}(t_1,t_2,t_3) = \tag{16}$$
$$h_3(t_1,t_2,t_3)*\{(\tilde{x}_1(t_1)e^{j\omega_1 t_1})(\tilde{x}_1(t_2)e^{j\omega_1 t_2})(\tilde{x}_1(t_3)e^{j\omega_1 t_3})^*+$$
$$(\tilde{x}_1(t_1)e^{j\omega_1 t_1})(\tilde{x}_1(t_2)e^{j\omega_1 t_2})(\tilde{x}_1(t_3)e^{j\omega_1 t_3})+$$
$$(\tilde{x}_1(t_1)e^{j\omega_1 t_1})^*(\tilde{x}_1(t_2)e^{j\omega_1 t_2})(\tilde{x}_1(t_3)e^{j\omega_1 t_3})+$$
$$(\tilde{x}_1(t_1)e^{j\omega_1 t_1})(\tilde{x}_2(t_2)e^{j\omega_2 t_2})(\tilde{x}_2(t_3)e^{j\omega_2 t_3})^*+$$
$$(\tilde{x}_1(t_1)e^{j\omega_1 t_1})(\tilde{x}_2(t_2)e^{j\omega_2 t_2})^*(\tilde{x}_2(t_3)e^{j\omega_2 t_3})+$$
$$(\tilde{x}_2(t_1)e^{j\omega_2 t_1})^*(\tilde{x}_1(t_2)e^{j\omega_1 t_2})(\tilde{x}_2(t_3)e^{j\omega_2 t_3})+$$
$$(\tilde{x}_2(t_1)e^{j\omega_2 t_1})^*(\tilde{x}_1(t_2)e^{j\omega_1 t_2})(\tilde{x}_2(t_3)e^{j\omega_2 t_3})+$$
$$(\tilde{x}_2(t_1)e^{j\omega_2 t_1})^*(\tilde{x}_2(t_2)e^{j\omega_2 t_2})^*(\tilde{x}_1(t_3)e^{j\omega_1 t_3})+$$
$$(\tilde{x}_2(t_1)e^{j\omega_2 t_1})^*(\tilde{x}_2(t_2)e^{j\omega_2 t_2})(\tilde{x}_1(t_3)e^{j\omega_1 t_3})\}.$$

The application of the Laplace transform to (15) and (16) yield the following expressions:

$$Y_{\omega_1,1}=\mathcal{L}(y_{\omega_1,1}(t))= \tag{17}$$
$$\mathcal{L}(h_1(t))\cdot\mathcal{L}(\tilde{x}_1(t)e^{j\omega_1 t}))=H_1(s)\tilde{X}_1(s-j\omega_1)Y_{\omega_1,3}(s_1,s_2,s_3)=$$
$$\mathcal{L}(y_{\omega_1,3}(t_1,t_2,t_3))=\mathcal{L}(h_3(t_1,t_2,t_3))\cdot$$
$$\{\mathcal{L}((\tilde{x}_1(t_1)e^{j\omega_1 t_1})(\tilde{x}_1(t_2)e^{j\omega_1 t_2})(\tilde{x}_1(t_3)e^{j\omega_1 t_3})^*)+$$
$$\mathcal{L}((\tilde{x}_1(t_1)e^{j\omega_1 t_1})(\tilde{x}_1(t_2)e^{j\omega_1 t_2})^*(\tilde{x}_1(t_3)e^{j\omega_1 t_3}))+$$
$$\mathcal{L}((\tilde{x}_1(t_1)e^{j\omega_1 t_1})^*(\tilde{x}_1(t_2)e^{j\omega_1 t_2})(\tilde{x}_1(t_3)e^{j\omega_1 t_3}))+$$
$$\mathcal{L}((\tilde{x}_1(t_1)e^{j\omega_1 t_1})(\tilde{x}_2(t_2)e^{j\omega_2 t_2})(\tilde{x}_2(t_3)e^{j\omega_2 t_3})^*)+$$
$$\mathcal{L}((\tilde{x}_1(t_1)e^{j\omega_1 t_1})(\tilde{x}_2(t_2)e^{j\omega_2 t_2})^*(\tilde{x}_2(t_3)e^{j\omega_2 t_3}))+$$
$$\mathcal{L}((\tilde{x}_1(t_1)e^{j\omega_1 t_1})(\tilde{x}_2(t_2)e^{j\omega_2 t_2})^*(\tilde{x}_2(t_3)e^{j\omega_2 t_3}))+$$
$$\mathcal{L}((\tilde{x}_2(t_1)e^{j\omega_2 t_2})^*(\tilde{x}_1(t_2)e^{j\omega_1 t_2})(\tilde{x}_2(t_3)e^{j\omega_2 t_3}))+$$
$$\mathcal{L}((\tilde{x}_2(t_1)e^{j\omega_2 t_1})(\tilde{x}_1(t_2)e^{j\omega_1 t_2})(\tilde{x}_2(t_3)e^{j\omega_2 t_3})^*)+$$
$$\mathcal{L}((\tilde{x}_2(t_1)e^{j\omega_2 t_1})(\tilde{x}_2(t_2)e^{j\omega_2 t_2})^*(\tilde{x}_1(t_3)e^{j\omega_1 t_3}))+$$
$$\mathcal{L}((\tilde{x}_2(t_1)e^{j\omega_2 t_1})^*(\tilde{x}_2(t_2)e^{j\omega_1 t_3}))\}=$$
$$\mathcal{L}(h_3(t_1,t_2,t_3))\cdot\{\mathcal{L}((\tilde{x}_1(t_1)e^{j\omega_1 t_1}))\mathcal{L}((\tilde{x}_1(t_2)e^{j\omega_1 t_2}))$$
$$\mathcal{L}((\tilde{x}_1(t_3)e^{j\omega_1 t_3})^*)+\mathcal{L}((\tilde{x}_1(t_1)e^{j\omega_1 t_1}))$$
$$\mathcal{L}((\tilde{x}_1(t_1)e^{j\omega_1 t_1}))\mathcal{L}((\tilde{x}_1(t_3)e^{j\omega_1 t_3}))+$$
$$\mathcal{L}((\tilde{x}_1(t_1)e^{j\omega_1 t_1})^*)\mathcal{L}((\tilde{x}_1(t_2)e^{j\omega_1 t_2}))$$
$$\mathcal{L}((\tilde{x}_1(t_3)e^{j\omega_1 t_3}))+\mathcal{L}((\tilde{x}_1(t_1)e^{j\omega_1 t_1}))$$
$$\mathcal{L}((\tilde{x}_2(t_2)e^{j\omega_2 t_2}))\mathcal{L}((\tilde{x}_2(t_3)e^{j\omega_2 t_3})^*)+$$
$$\mathcal{L}((\tilde{x}_1(t_1)e^{j\omega_1 t_1}))\mathcal{L}((\tilde{x}_2(t_2)e^{j\omega_2 t_2})^*)$$
$$\mathcal{L}((\tilde{x}_2(t_3)e^{j\omega_2 t_3}))+\mathcal{L}((\tilde{x}_2(t_1)e^{j\omega_2 t_1})^*)$$
$$\mathcal{L}((\tilde{x}_1(t_2)e^{j\omega_1 t_2}))\mathcal{L}((\tilde{x}_2(t_3)e^{j\omega_2 t_3}))+$$
$$\mathcal{L}((\tilde{x}_2(t_1)e^{j\omega_2 t_1}))\mathcal{L}((\tilde{x}_1(t_2)e^{j\omega_1 t_2}))$$

-continued
$$\mathcal{L}((\tilde{x}_2(t_3)e^{j\omega_2 t_3})^*) + \mathcal{L}((\tilde{x}_2(t_1)e^{j\omega_2 t_1}))$$
$$\mathcal{L}((\tilde{x}_2(t_2)e^{j\omega_2 t_2})^*)\mathcal{L}((\tilde{x}_1(t_3)e^{j\omega_1 t_3})) +$$
$$\mathcal{L}((\tilde{x}_2(t_1)e^{j\omega_2 t_1})^*)\mathcal{L}((\tilde{x}_2(t_2)e^{j\omega_2 t_2})) $$
$$\mathcal{L}((\tilde{x}_1(t_3)e^{j\omega_1 t_3}))\} =$$

$$H_3(s_1, s_2, s_3) \cdot \{\tilde{X}_1(s_1 - j\omega_1)X_1^*((s_3 - j\omega_1)^*) +$$
$$\tilde{X}_1(s_1 - j\omega_1)\tilde{X}_1^*((s_2 - j\omega_1)^*)\tilde{X}_1(s_3 - j\omega_1) +$$
$$\tilde{X}_1^*((s_1 - j\omega_1)^*)\tilde{X}_1(s_2 - j\omega_1)\tilde{X}_1(s_3 - j\omega_1) +$$
$$\tilde{X}_1(s_1 - j\omega_1)\tilde{X}_2(s_2 - j\omega_2)\tilde{X}_2^*((s_3 - j\omega_2)^*) +$$
$$\tilde{X}_1(s_1 - j\omega_1)\tilde{X}_2^*((s_2 - j\omega_2)^*)\tilde{X}_2(s_3 - j\omega_2) +$$
$$\tilde{X}_2^*((s_1 - j\omega_2)^*)\tilde{X}_1(s_2 - j\omega_1)\tilde{X}_2(s_3 - j\omega_2) +$$
$$\tilde{X}_2(s_1 - j\omega_2)\tilde{X}_1(s_2 - j\omega_1)\tilde{X}_2^*((s_3 - j\omega_2)^*) +$$
$$\tilde{X}_2(s_1 - j\omega_2)\tilde{X}_2^*((s_2 - j\omega_2)^*)\tilde{X}_1(s_3 - j\omega_1) +$$
$$\tilde{X}_2^*((s_1 - j\omega_2)^*)\tilde{X}_2(s_2 - j\omega_2)\tilde{X}_1(s_3 - j\omega_1)\}$$

Since $\tilde{X}_1$ and $\tilde{X}_2$ are band limited signals, the third order distortion terms in (18) are non-zero only in a range of a frequency intervals. For example, $\tilde{X}_1(s_1-j\omega_1)\tilde{X}_2(s_2-j\omega_2)\tilde{X}_2^*((s_3-j\omega_2)^*)$ is non-zero only when $s_1 \in I_1$, $s_2 \in I_2$, $s_3 \in I_2$, where $$I_1 = \left[\omega_1 - \frac{B}{2}, \omega_1 + \frac{B}{2}\right]; \quad I_2 = \left[\omega_2 - \frac{B}{2}, \omega_2 + \frac{B}{2}\right]$$

where B designates the bandwidth of the distortion term. Accordingly, one can redefine $H_3(s_1, s_2, s_3)$ as follows:

$$H_3(s_1, s_2, s_3) = \begin{cases} H_{3,s}(s_1, s_2, s_3) & \text{for } s_i \in I_1, i = 1; 2; 3 \\ H_{3,d1}(s_1, s_2, s_3) & \text{for } s_1 \in I_1, s_i \in I_2 i = 2; 3 \\ H_{3,d2}(s_1, s_2, s_3) & \text{for } s_2 \in I_1, s_i \in I_2 i = 1; 3 \\ H_{3,d3}(s_1, s_2, s_3) & \text{for } s_3 \in I_1, s_i \in I_2 i = 1; 2 \end{cases}$$

Hence, (18) can be rewritten as $$Y_{\omega_1,3}(s_1, s_2, s_3) = Y_{\omega_1,3,1}(s_1, s_2, s_3) +$$
$$Y_{\omega_1,3,2}(s_1, s_2, s_3) + Y_{\omega_1,3,3}(s_1, s_2, s_3) + Y_{\omega_1,3,4}(s_1, s_2, s_3)$$
where
$$Y_{\omega_1,3,1}(s_1, s_2, s_3) =$$
$$H_{3,s}(s_1, s_2, s_3) \cdot \{\tilde{X}_1(s_1 - j\omega_1)\tilde{X}_1(s_2 - j\omega_1)\tilde{X}_1^*((s_3 - j\omega_1)^*) +$$
$$\tilde{X}_1(s_1 - j\omega_1)\tilde{X}_1^*((s_2 - j\omega_1)^*)\tilde{X}_1(s_3 - j\omega_1) +$$
$$\tilde{X}_1^*((s_1 - j\omega_1)^*)\tilde{X}_1(s_2 - j\omega_1)\tilde{X}_1(s_3 - j\omega_1)\}$$
$$Y_{\omega_1,3,2}(s_1, s_2, s_3) = H_{3,d1}(s_1, s_2, s_3) \cdot$$
$$\{\tilde{X}_1(s_1 - j\omega_1)\tilde{X}_2(s_2 - j\omega_2)\tilde{X}_2^*((s_3 - j\omega_2)^*) +$$
$$\tilde{X}_1(s_1 - j\omega_1)\tilde{X}_2^*((s_2 - j\omega_2)^*)\tilde{X}_2(s_3 - j\omega_2)\}$$
$$Y_{\omega_1,3,3}(s_1, s_2, s_3) =$$
$$H_{3,d2}(s_1, s_2, s_3) \cdot \{\tilde{X}_2^*((s_1 - j\omega_2)^*)\tilde{X}_1(s_2 - j\omega_1)\tilde{X}_2(s_3 - j\omega_2) +$$
$$\tilde{X}_2(s_1 - j\omega_2)\tilde{X}_1(s_2 - j\omega_1)\tilde{X}_2^*((s_3 - j\omega_2)^*)\}$$
$$Y_{\omega_1,3,4}(s_1, s_2, s_3) = H_{3,d3}(s_1, s_2, s_3) \cdot$$
$$\{\tilde{X}_2(s_1 - j\omega_2)\tilde{X}_2^*((s_2 - j\omega_2)^*)\tilde{X}_1(s_3 - j\omega_1) +$$
$$\tilde{X}_2^*((s_1 - j\omega_2)^*)\tilde{X}_2(s_2 - j\omega_2)\tilde{X}_1(s_3 - j\omega_1)\}$$
(19)

Exploiting the symmetry of H_3 (s_1,s_2,s_3), yields the following relation $H_3(s_1, s_2, s_3) = H_3(s_2, s_1, s_3) = H_3(s_3, s_2, s_1)$ $\forall s_1, s_2, s_3$ from which the following equalities can be deduced.

$$H_{3,d1}(s_1,s_2,s_3) = H_{3,d2}(s_2,s_1,s_3) = H_{3,d3}(s_3,s_2,s_1)$$

Consequently a single kernel $H_{3,d}$ can be used instead of the three separate ones where only the variable order is adjusted each time as shown below:

$$H_{3,d1}(s_1,s_2,s_3) = H_{3,d}(s_1,s_2,s_3)$$
$$H_{3,d2}(s_1,s_2,s_3) = H_{3,d}(s_2,s_1,s_3) \quad (20)$$
$$H_{3,d3}(s_1,s_2,s_3) = H_{3,d}(s_3,s_2,s_1)$$

Substituting (20) in (19) yields a new expression $$Y_{\omega_1,3,1}(s_1, s_2, s_3) =$$
$$H_{3,s}(s_1, s_2, s_3) \cdot \{\tilde{X}_1(s_1 - j\omega_1)\tilde{X}_1(s_2 - j\omega_1)\tilde{X}_1^*((s_3 - j\omega_1)^*) +$$
$$\tilde{X}_1(s_1 - j\omega_1)\tilde{X}_1^*((s_2 - j\omega_1)^*)\tilde{X}_1(s_3 - j\omega_1) +$$
$$\tilde{X}_1^*((s_1 - j\omega_1)^*)\tilde{X}_1(s_2 - j\omega_1)\tilde{X}_1(s_3 - j\omega_1)\}$$
$$Y_{\omega_1,3,2}(s_1, s_2, s_3) = \quad (21)$$
$$H_{3,d}(s_1, s_2, s_3) \cdot \{\tilde{X}_1(s_1 - j\omega_1)\tilde{X}_2(s_2 - j\omega_2)\tilde{X}_2^*((s_3 - j\omega_2)^*) +$$
$$\tilde{X}_1(s_1 - j\omega_1)\tilde{X}_2^*((s_2 - j\omega_2)^*)\tilde{X}_2(s_3 - j\omega_2)\}$$
$$Y_{\omega_1,3,3}(s_1, s_2, s_3) = H_{3,d}(s_2, s_1, s_3) \cdot$$
$$\{\tilde{X}_2^*((s_1 - j\omega_2)^*)\tilde{X}_1(s_2 - j\omega_1)\tilde{X}_2(s_3 - j\omega_2) +$$
$$\tilde{X}_2(s_1 - j\omega_2)\tilde{X}_1(s_2 - j\omega_1)\tilde{X}_2^*((s_3 - j\omega_2)^*)\}$$
$$Y_{\omega_1,3,4}(s_1, s_2, s_3) = H_{3,d}(s_3, s_2, s_1) \cdot$$
$$\{\tilde{X}_2(s_1 - j\omega_2)\tilde{X}_2^*((s_2 - j\omega_2)^*)\tilde{X}_1(s_3 - j\omega_1) +$$
$$\tilde{X}_2^*((s_1 - j\omega_2)^*)\tilde{X}_2(s_2 - j\omega_2)\tilde{X}_1(s_3 - j\omega_1)\}$$

The application of a frequency translation in Laplace domain to (17) and (21) allows for passband to baseband equivalent transformation of $y_{\omega_1}{,}^1$ and $y_{\omega_1,3}(t)$ in the time domain. The frequency translation of $j\omega_k$ is performed by replacing $s_i$ in (17) an (21) with $u_i = s_i - j\omega_k$; i=1, 2, 3; k=1, 2. Hence, the application of the frequency translation to $Y_{\omega_1,1}(s)$. $Y_{\omega_1,3}(s_1, s_2, s_3)$. $H_1(s)$, $H_{3,s}(s_1, s_2, s_3)$, and $H_{3,d}(s_1, s_2, s_3)$ yields the following baseband equivalent expressions in the Laplace domain.

$$\tilde{Y}_{\omega_1,1}(u_1) = Y_{\omega_1,1}(u_1 + j\omega_1) = H_1(u_1 + j\omega_1)\tilde{X}_1(u_1) = \tilde{H}_1(u_1)\tilde{X}(u_1) \quad (22)$$

$$\tilde{Y}_{\omega_1,3}(u_1, u_2, u_3) = \tilde{Y}_{\omega_1,3,1}(u_1, u_2, u_3) + \quad (23)$$
$$\tilde{Y}_{\omega_1,3,2}(u_1, u_2, u_3) + \tilde{Y}_{\omega_1,3,3}(u_1, u_2, u_3) + \tilde{Y}_{\omega_1,3,4}(u_1, u_2, u_3)$$

where:

$$\tilde{Y}_{\omega_1,3,1}(u_1, u_2, u_3) = Y_{\omega_1,3,1}(u_1 + j\omega_1, u_2 + j\omega_1, u_3 + j\omega_1)$$
$$= H_{3,s}(u_1 + j\omega_1, u_2 + j\omega_1, u_3 + j\omega_1) \cdot$$
$$\{\tilde{X}_1(u_1)\tilde{X}_1(u_2)\tilde{X}_1^*((u_3)^*) +$$
$$\tilde{X}_1(u_1)\tilde{X}_1^*((u_2)^*)\tilde{X}_1(u_3) +$$
$$\tilde{X}_1^*((u_1)^*)\tilde{X}_1(u_2)\tilde{X}_1(u_3)\}$$
$$= \tilde{H}_{3,s}(u_1, u_2, u_3) \cdot$$
$$\{\tilde{X}_1(u_1)\tilde{X}_1(u_2)\tilde{X}_1^*((u_3)^*) +$$
$$\tilde{X}_1(u_1)\tilde{X}_1^*((u_2)^*)\tilde{X}_1(u_3) +$$
$$\tilde{X}_1^*((u_1)^*)\tilde{X}_1(u_2)\tilde{X}_1(u_3)\}$$

-continued $$\tilde{Y}_{\omega_1,3,2}(u_1, u_2, u_3) = Y_{\omega_1,3,2}(u_1 + j\omega_1, u_2 + j\omega_2, u_3 + j\omega_2)$$
$$= H_{3,d}(u_1 + j\omega_1, u_2 + j\omega_2, u_3 + j\omega_2) \cdot$$
$$\{\tilde{X}_1(u_1)\tilde{X}_2(u_2)\tilde{X}_2^*((u_3)^*) +$$
$$\tilde{X}_1(u_1)\tilde{X}_2^*((u_2)^*)\tilde{X}_2(u_3)\}$$
$$= \tilde{H}_{3,d}(u_1, u_2, u_3) \cdot$$
$$\{\tilde{X}_1(u_1)\tilde{X}_2(u_2)\tilde{X}_2^*((u_3)^*) +$$
$$\tilde{X}_1(u_1)\tilde{X}_2^*((u_2)^*)\tilde{X}_2(u_3)\}$$

$$\tilde{Y}_{\omega_1,3,3}(u_1, u_2, u_3) = Y_{\omega_1,3,3}(u_1 + j\omega_2, u_2 + j\omega_1, u_3 + j\omega_2)$$
$$= H_{3,d}(u_2 + j\omega_1, u_1 + j\omega_2, u_3 + j\omega_2) \cdot$$
$$\{\tilde{X}_2^*((u_1)^*)\tilde{X}_1(u_2)\tilde{X}_2(u_3) +$$
$$\tilde{X}_2(u_1)\tilde{X}_1(u_2)\tilde{X}_2^*((u_3)^*)\}$$
$$= \tilde{H}_{3,d}(u_2, u_1, u_3) \cdot$$
$$\{\tilde{X}_2^*((u_1)^*)\tilde{X}_1(u_2)\tilde{X}_2(u_3) +$$
$$\tilde{X}_2(u_1)\tilde{X}_1(u_2)\tilde{X}_2^*((u_3)^*)\}$$

$$\tilde{Y}_{\omega_1,3,4}(u_1, u_2, u_3) = Y_{\omega_1,3,4}(u_1 + j\omega_2, u_2 + j\omega_2, u_3 + j\omega_1)$$
$$= H_{3,d}(u_3 + j\omega_1, u_2 + j\omega_2, u_1 + j\omega_2) \cdot$$
$$\{\tilde{X}_2(u_1)\tilde{X}_2^*((u_2)^*)\tilde{X}_1(u_3) +$$
$$\tilde{X}_2^*((u_1)^*)\tilde{X}_2(u_2)\tilde{X}_1(u_3)\}$$
$$= \tilde{H}_{3,d}(u_3, u_2, u_1) \cdot$$
$$\{\tilde{X}_2(u_1)\tilde{X}_2^*((u_2)^*)\tilde{X}_1(u_3) +$$
$$\tilde{X}_2^*((u_1)^*)\tilde{X}_2(u_2)\tilde{X}_1(u_3)\}$$

The application of the inverse Laplace to (22) and (23) yields the following time domain expressions of the baseband equivalent terms:

$$\tilde{y}_{\omega_1,1}(t) = \int_{-\infty}^{\infty} \tilde{h}_1(\tau_1) \cdot \tilde{x}_1(t - \tau_1) \cdot d\tau_1 \quad (24)$$

$$\tilde{y}_{\omega_1,3,1}(t) =$$
$$\int_{-\infty}^{\infty}\int_{-\infty}^{\infty}\int_{-\infty}^{\infty} \tilde{h}_{3,s}(\tau_1, \tau_2, \tau_3) \cdot \{(\tilde{x}_1(t-\tau_1))(\tilde{x}_1(t-\tau_2))$$
$$(\tilde{x}_1(t-\tau_3))^* + (\tilde{x}_1(t-\tau_1))(\tilde{x}_1(t-\tau_2))^*$$
$$(\tilde{x}_1(t-\tau_3)) + (\tilde{x}_1(t-\tau_1))^*(\tilde{x}_1(t-\tau_2))$$
$$(\tilde{x}_1(t-\tau_3))\} \cdot d\tau_3 d\tau_2 d\tau_1$$

$$\tilde{y}_{\omega_1,3,2}(t) = \int_{-\infty}^{\infty}\int_{-\infty}^{\infty}\int_{-\infty}^{\infty} \tilde{h}_{3,d}(\tau_1, \tau_2, \tau_3) \cdot$$
$$\{(\tilde{x}_1(t-\tau_1))(\tilde{x}_2(t-\tau_2))^* + (\tilde{x}_2(t-\tau_3)) +$$
$$(\tilde{x}_1(t-\tau_1))(\tilde{x}_2(t-\tau_2))^*(\tilde{x}_2(t-\tau_3))\} \cdot$$
$$d\tau_3 d\tau_2 d\tau_1$$

$$\tilde{y}_{\omega_1,3,3}(t) = \int_{-\infty}^{\infty}\int_{-\infty}^{\infty}\int_{-\infty}^{\infty} \tilde{h}_{3,d}(\tau_2, \tau_1, \tau_3) \cdot$$
$$\{+(\tilde{x}_2(t-\tau_1))^*(\tilde{x}_1(t-\tau_2))(\tilde{x}_2(t-\tau_3)) +$$
$$(\tilde{x}_2(t-\tau_1))(\tilde{x}_1(t-\tau_2))(\tilde{x}_2(t-\tau_3))^*\} \cdot$$
$$d\tau_3 d\tau_2 d\tau_1$$

$$\tilde{y}_{\omega_1,3,4}(t) = \int_{-\infty}^{\infty}\int_{-\infty}^{\infty}\int_{-\infty}^{\infty} \tilde{h}_{3,d}(\tau_3, \tau_2, \tau_1) \cdot$$
$$\{+(\tilde{x}_2(t-\tau_1))(\tilde{x}_2(t-\tau_2))^*(\tilde{x}_1(t-\tau_3)) +$$
$$(\tilde{x}_2(t-\tau_1))^*(\tilde{x}_2(t-\tau_2))$$
$$(\tilde{x}_1(t-\tau_3))\} \cdot d\tau_3 d\tau_2 d\tau_1$$

Swapping $\tau_2$ with $\tau_1$ in $\tilde{y}_{\omega_1,3,3}(t)$ and $\tau_3$ with $\tau_1$ in $\tilde{y}_{\omega_1,3,4}$ yields the following equality $$\tilde{y}_{\omega_1,3,2}(t) = \tilde{y}_{\omega_1,3,3}(t) = \tilde{y}_{\omega_1,3,4}(t)$$

Figure 5:
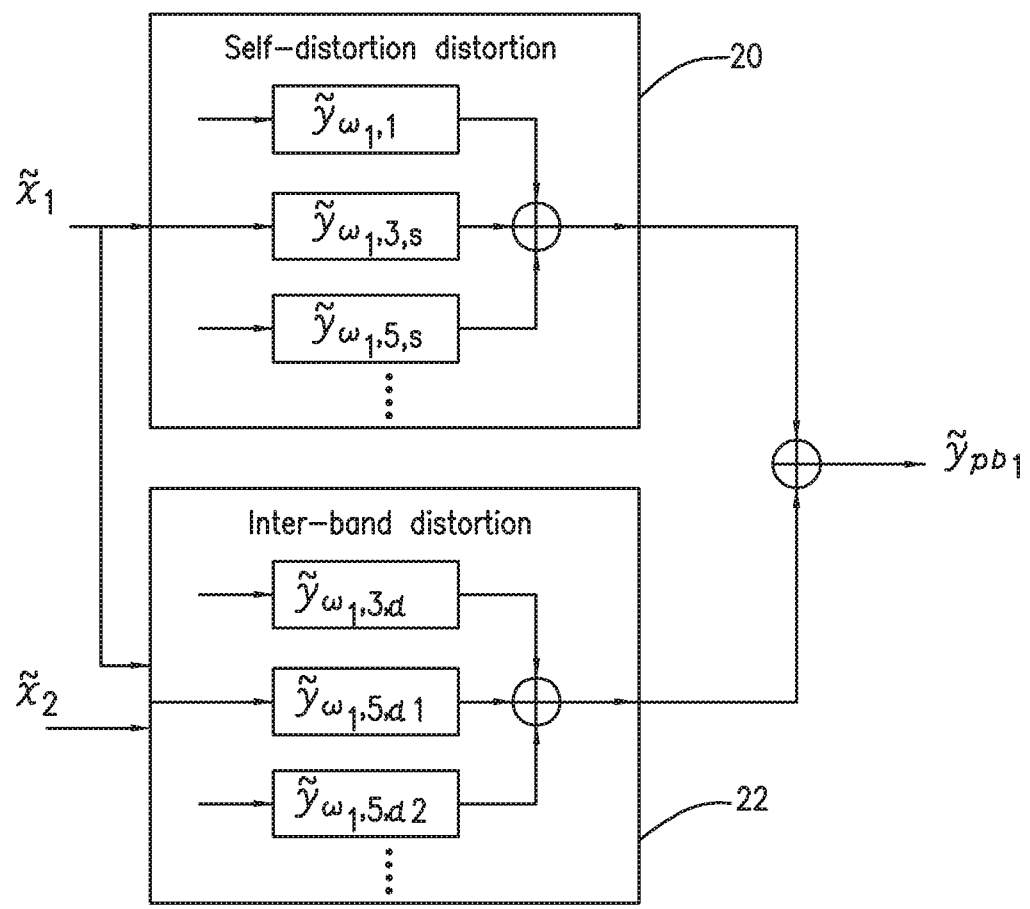
FIG. 5 is a block diagram of grouping of distortion terms grouped according to whether the terms are self-distortion terms or inter-band distortion terms.
Figure 6:
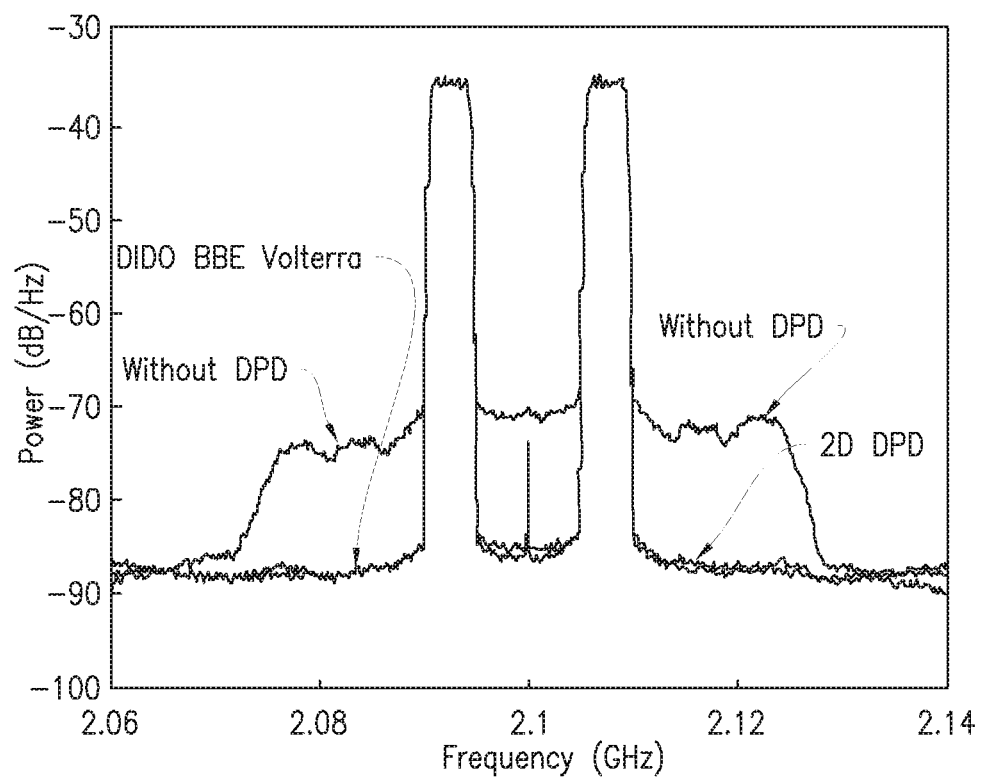
FIG. 6 is a plot of outputs of a power amplifier with no pre-distortion, with 2D DPD, and with dual band base band equivalent (BBE) Volterra series DPD for a first input signal of a first dual band input signal.
Figure 7:
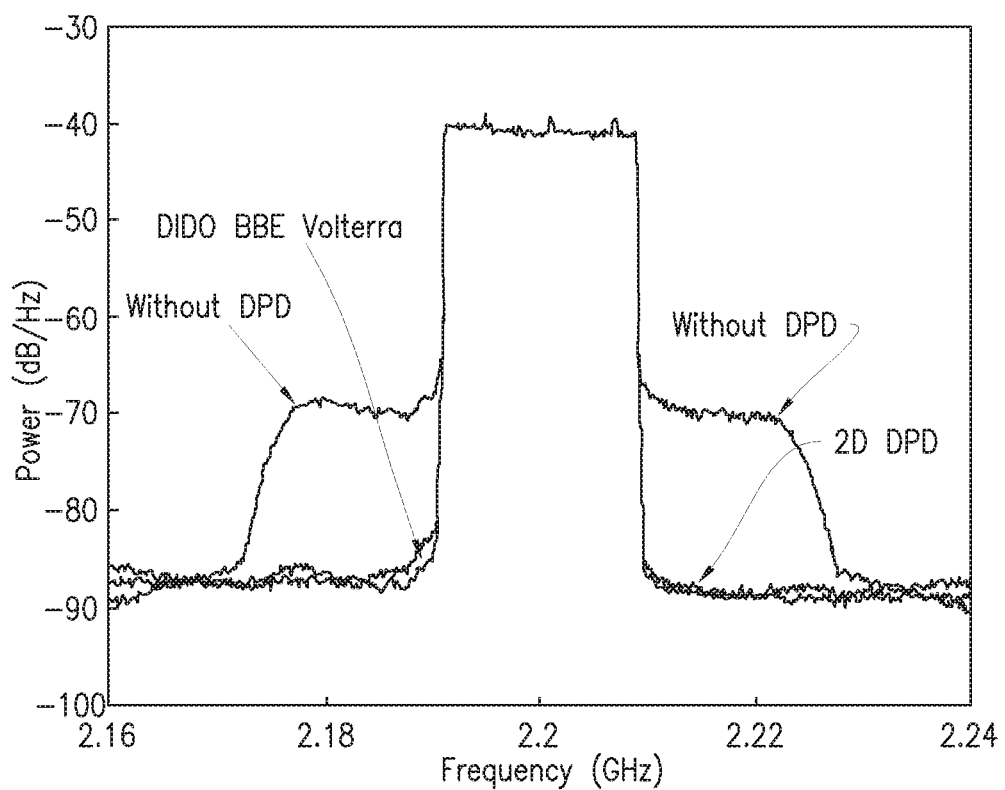
FIG. 7 is a plot of outputs of a power amplifier with no pre-distortion, with 2D DPD, and with dual band base band equivalent (BBE) Volterra series DPD for a second input signals of the first dual band input signal.
Figure 8:
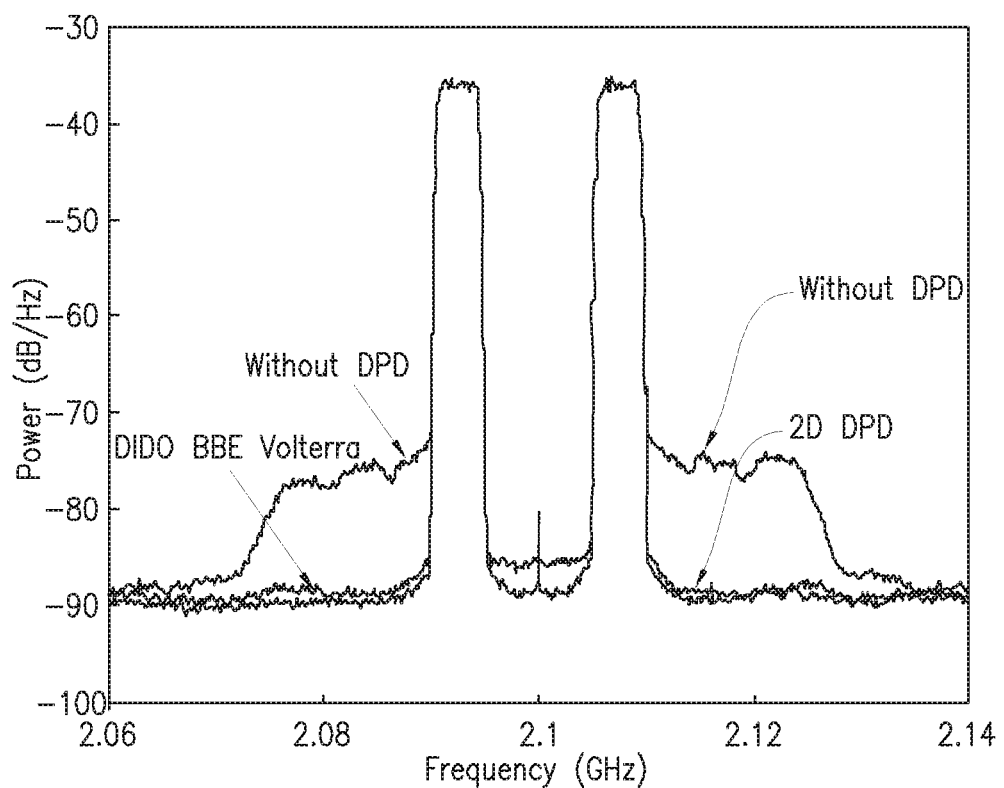
FIG. 8 is a plot of outputs of a power amplifier with no pre-distortion, with 2D DPD, and with dual band base band equivalent (BBE) Volterra series DPD for a first input signal of a second dual band input signal.
Figure 9:
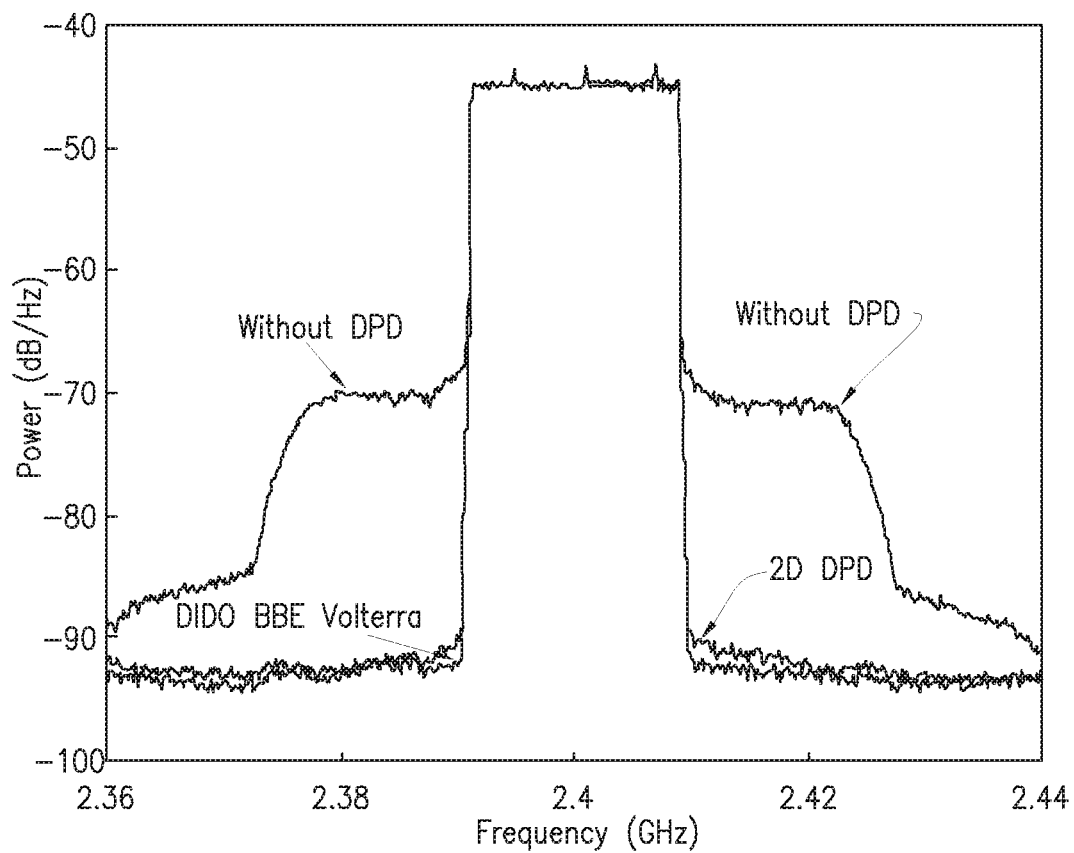
FIG. 9 is a plot of outputs of a power amplifier with no pre-distortion, with 2D DPD, and with dual band base band equivalent (BBE) Volterra series DPD for a second input signals of the second dual band input signal.
Figure 10:
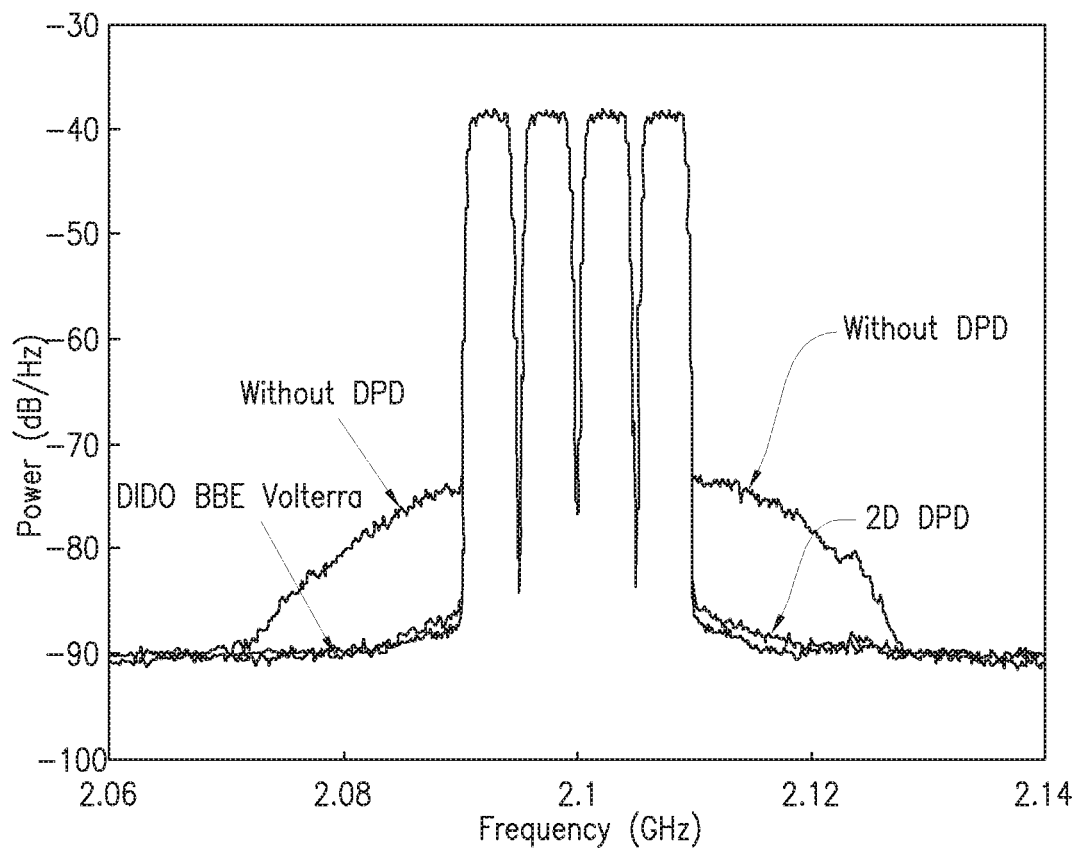
FIG. 10 is a plot of outputs of a power amplifier with no pre-distortion, with 2D DPD, and with dual band base band equivalent (BBE) Volterra series DPD for a first input signal of a third dual band input signal.
Figure 11:
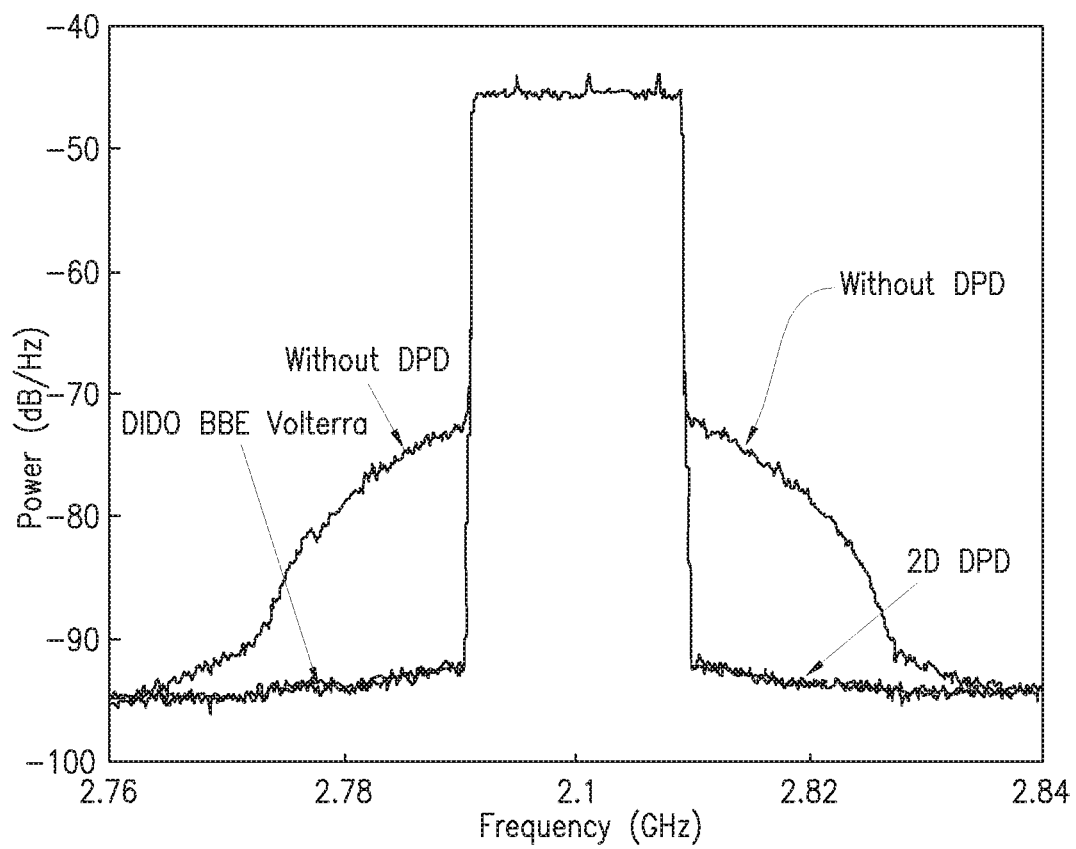
FIG. 11 is a plot of outputs of a power amplifier with no pre-distortion, with 2D DPD, and with dual band base band equivalent (BBE) Volterra series DPD for a second input signals of the third dual band input signal.

Hence, the third order baseband equivalent Volterra term could be re-written as:

$$\tilde{y}_{\omega_1,3}(t) = \tilde{y}_{\omega_1,3,1}(t) + 3\tilde{y}_{\omega_1,3,2}(t) \quad (25)$$
$$= \tilde{y}_{\omega_1,3,s}(t) + \tilde{y}_{\omega_1,3,d}(t)$$

where $\tilde{y}_{\omega_1,3,s}(t) = \tilde{y}_{\omega_1,3,1}(t)$ designates the PA third order single-band self-distortion term 20 and $\tilde{y}_{\omega_1,3,d}(t) = 3\tilde{y}_{\omega_1,3,2}(t)$ denotes the PA third order dual-band inter-band-distortion term 22, as shown in FIG. 5. These terms are, collectively, the baseband equivalent Volterra series which, when discretized as explained below, model the pre-distortion of a dual band power amplifier.

The same derivations were applied to construct the fifth order Volterra distortion term expression which is found to be $$\tilde{y}_{\omega_1,5}(t) = \tilde{y}_{\omega_1,5,s}(t) + \tilde{y}_{\omega_1,5,d1}(t) + \tilde{y}_{\omega_1,5d2}(t) \quad (26)$$

where $$\tilde{y}_{\omega_1,5,s}(t) = \int_{-\infty}^{\infty}\int_{-\infty}^{\infty}\int_{-\infty}^{\infty}\int_{-\infty}^{\infty}\int_{-\infty}^{\infty} \tilde{h}_{5,s}(\tau_1, \tau_2, \tau_3, \tau_4, \tau_5) \cdot$$
$$\{(\tilde{x}_1(t-\tau_1))(\tilde{x}_1(t-\tau_2))(\tilde{x}_1(t-\tau_3))(\tilde{x}_1(t-\tau_4))^*$$
$$(\tilde{x}_1(t-\tau_5))^* + (\tilde{x}_1(t-\tau_1))(\tilde{x}_1(t-\tau_2))$$
$$(\tilde{x}_1(t-\tau_3))^*(\tilde{x}_1(t-\tau_4))(\tilde{x}_1(t-\tau_5))^* +$$
$$(\tilde{x}_1(t-\tau_1))(\tilde{x}_1(t-\tau_2))^*(\tilde{x}_1(t-\tau_3))$$
$$(\tilde{x}_1(t-\tau_4))(\tilde{x}_1(t-\tau_5))^* +$$
$$(\tilde{x}_1(t-\tau_1))^*(\tilde{x}_1(t-\tau_2))(\tilde{x}_1(t-\tau_3))$$
$$(\tilde{x}_1(t-\tau_4))(\tilde{x}_1(t-\tau_5))^* + (\tilde{x}_1(t-\tau_1))$$
$$(\tilde{x}_1(t-\tau_2))(\tilde{x}_1(t-\tau_3))^*(\tilde{x}_1(t-\tau_4))^*$$
$$(\tilde{x}_1(t-\tau_5)) + (\tilde{x}_1(t-\tau_1))^*(\tilde{x}_1(t-\tau_2))(\tilde{x}_1(t-\tau_3))$$
$$(\tilde{x}_1(t-\tau_4))^*(\tilde{x}_1(t-\tau_5)) +$$
$$(\tilde{x}_1(t-\tau_1))(\tilde{x}_1(t-\tau_2))^*(\tilde{x}_1(t-\tau_3))^*$$
$$(\tilde{x}_1(t-\tau_4))(\tilde{x}_1(t-\tau_5)) +$$
$$(\tilde{x}_1(t-\tau_1))^*(\tilde{x}_1(t-\tau_2))(\tilde{x}_1(t-\tau_3))^*$$
$$(\tilde{x}_1(t-\tau_4))(\tilde{x}_1(t-\tau_5)) +$$
$$(\tilde{x}_1(t-\tau_1))^*(\tilde{x}_1(t-\tau_2))^*(\tilde{x}_1(t-\tau_3))$$
$$(\tilde{x}_1(t-\tau_4))(\tilde{x}_1(t-\tau_5))\} \cdot$$
$$d\tau_5 d\tau_4 d\tau_3 d\tau_2 d\tau_1$$

$$\tilde{y}_{\omega_1,5,d1}(t) = \int_{-\infty}^{\infty}\int_{-\infty}^{\infty}\int_{-\infty}^{\infty}\int_{-\infty}^{\infty}\int_{-\infty}^{\infty} \tilde{h}_{5,d1}(\tau_1, \tau_2, \tau_3, \tau_4, \tau_5) \cdot$$
$$\{+(\tilde{x}_1(t-\tau_1))(\tilde{x}_1(t-\tau_2))^*(\tilde{x}_1(t-\tau_3))(\tilde{x}_2(t-\tau_4))$$

-continued
$$(\tilde{x}_2(t-\tau_5))^* + (\tilde{x}_1(t-\tau_1))^*(\tilde{x}_1(t-\tau_2))$$
$$(\tilde{x}_1(t-\tau_3))(\tilde{x}_2(t-\tau_4))(\tilde{x}_2(t-\tau_5))^* +$$
$$(\tilde{x}_1(t-\tau_1))(\tilde{x}_1(t-\tau_2))(\tilde{x}_1(t-\tau_3))^*$$
$$(\tilde{x}_2(t-\tau_4))^*(\tilde{x}_2(t-\tau_5))+(\tilde{x}_1(t-\tau_1))$$
$$(\tilde{x}_1(t-\tau_2))^*(\tilde{x}_1(t-\tau_3))(\tilde{x}_2(t-\tau_4))^*$$
$$(\tilde{x}_2(t-\tau_5))+(\tilde{x}_1(t-\tau_1))^*(\tilde{x}_1(t-\tau_2))$$
$$(\tilde{x}_1(t-\tau_3))(\tilde{x}_2(t-\tau_4))^*(\tilde{x}_2(t-\tau_5))\} \cdot$$
$$d\tau_5 d\tau_4 d\tau_3 d\tau_2 d\tau_1$$

$$\tilde{y}_{\omega_1,5,d2}(t) = \int_{-\infty}^{\infty}\int_{-\infty}^{\infty}\int_{-\infty}^{\infty}\int_{-\infty}^{\infty}\int_{-\infty}^{\infty} \tilde{h}_{5,d1}(\tau_1,\tau_2,\tau_3,\tau_4,\tau_5) \cdot$$
$$\{(\tilde{x}_1(t-\tau_1))(\tilde{x}_2(t-\tau_2))(\tilde{x}_2(t-\tau_3))$$
$$(\tilde{x}_2(t-\tau_4))^*(\tilde{x}_2(t-\tau_5))^* +$$
$$(\tilde{x}_1(t-\tau_1))(\tilde{x}_2(t-\tau_2))(\tilde{x}_2(t-\tau_3))^*$$
$$(\tilde{x}_2(t-\tau_3))(\tilde{x}_2(t-\tau_4))(\tilde{x}_2(t-\tau_5))^* +$$
$$(\tilde{x}_1(t-\tau_1))(\tilde{x}_2(t-\tau_2))^*(\tilde{x}_2(t-\tau_3))$$
$$(\tilde{x}_2(t-\tau_4))(\tilde{x}_2(t-\tau_5))^* + (\tilde{x}_1(t-\tau_1))$$
$$(\tilde{x}_2(t-\tau_2))(\tilde{x}_2(t-\tau_3))^*(\tilde{x}_2(t-\tau_4))^*$$
$$(\tilde{x}_2(t-\tau_5))+(\tilde{x}_1(t-\tau_1))(\tilde{x}_2(t-\tau_2))^*$$
$$(\tilde{x}_2(t-\tau_3))(\tilde{x}_2(t-\tau_4))^*(\tilde{x}_2(t-\tau_5)) +$$
$$(\tilde{x}_1(t-\tau_1))(\tilde{x}_2(t-\tau_2))^*(\tilde{x}_2(t-\tau_3))^*$$
$$(\tilde{x}_2(t-\tau_4))(\tilde{x}_2(t-\tau_5))\} \cdot$$
$$d\tau_5 d\tau_4 d\tau_3 d\tau_2 d\tau_1$$

Hence, the continuous-time dual-band baseband equivalent Volterra series model for each band is given by:

$$\tilde{y}_{\omega_1}(t) = \tilde{y}_{\omega_1,1}(t) + \tilde{y}_{\omega_1,3}(t) + \tilde{y}_{\omega_1,5}(t) + \quad (27)$$

Step 5: Discrete-time baseband equivalent Volterra series model: In order to implement the dual band BBE Volterra model in a digital processor, the following signal and systems properties and approximations are used to further simplify (27).
1. Truncation of the Volterra model to a finite nonlinearity order NL, generally in the range of 5 to 7.
2. Limitation of the integral bounds $(-\infty, +\infty)$ to $(0, T_\infty)$ using the signal and system causality, and the fading memory assumption (transient response time invariant Volterra series is defined as $t<T_\infty$) [43]. Since the impulse responses of different Volterra kernels, i.e. $\tilde{h}_{\omega_1,1}, \tilde{h}_{\omega_1,3,s}, \tilde{h}_{\omega_1,3,d}, \tilde{h}_{\omega_1,5,s}, \ldots$ represent different aspects of the system, the memory spans used in the computation of the different distortion terms can be set to be different.
3. Using the symmetry of the terms inside the integral (Distortion components are symmetrical and Volterra kernels can be symmetrized), the number of required kernels is significantly reduced.

Digitizing the dual band BBE Volterra model yields:

$$\tilde{y}_{\omega_1,1}(n) = \tilde{y}_{\omega_1,1}(n) + \tilde{y}_{\omega_1,3}(n) + \tilde{y}_{\omega_1,5}(n) + \cdots \quad (28)$$

$$\tilde{y}_{\omega_1,1}(n) = \sum_{i_1=0}^{M_1} \tilde{h}_{\omega_1,1}(i_1)\tilde{x}_{1,s}(n,i_1)$$

$$\tilde{y}_{\omega_1,3}(n) = \sum_{i_1=0}^{M_{3,s}}\sum_{i_2=i_1}^{M_{3,s}}\sum_{i_3=i_2}^{M_{3,s}} \tilde{h}_{\omega_1,3,s}(i_1,i_2,i_3) \cdot \tilde{x}_{3,s}(n,i_1,i_2,i_3) +$$
$$\sum_{i_1=0}^{M_{3,d}}\sum_{i_2=i_1}^{M_{3,d}}\sum_{i_3=i_2}^{M_{3,d}} \tilde{h}_{\omega_1,3,d}(i_1,i_2,i_3) \cdot \tilde{x}_{3,d}(n,i_1,i_2,i_3)$$

$$\tilde{y}_{\omega_1,5}(n) =$$
$$\sum_{i_1=0}^{M_{5,s}}\sum_{i_2=i_1}^{M_{5,s}}\sum_{i_3=i_2}^{M_{5,s}}\sum_{i_4=i_3}^{M_{5,s}}\sum_{i_5=i_4}^{M_{5,s}} \tilde{h}_{\omega_1,5,s}(i_1,i_2,i_3,i_4,i_5) \cdot \tilde{x}_{5,s}(n,i_1,i_2,$$
$$i_3,i_4,i_5) +$$
$$\sum_{i_1=0}^{M_{5,d1}}\sum_{i_2=i_1}^{M_{5,d1}}\sum_{i_3=i_2}^{M_{5,d1}}\sum_{i_4=i_3}^{M_{5,d1}}\sum_{i_5=i_4}^{M_{5,d1}} \tilde{h}_{\omega_1,5,d1}(i_1,i_2,i_3,i_4,i_5) \cdot$$
$$\tilde{x}_{5,d1}(n,i_1,i_2,i_3,i_4,i_5) +$$
$$\sum_{i_1=0}^{M_{5,d2}}\sum_{i_2=0}^{M_{5,d2}}\sum_{i_3=i_2}^{M_{5,d2}}\sum_{i_4=i_3}^{M_{5,d2}}\sum_{i_5=i_4}^{M_{5,d2}} \tilde{h}_{\omega_1,5,d2}(i_1,i_2,i_3,i_4,i_5) \cdot$$
$$\tilde{x}_{5,d2}(n,i_1,i_2,i_3,i_4,i_5)$$

where $$\tilde{x}_{1,s}(n,i_1) = \tilde{x}(n-i_1)$$

$$\tilde{x}_{3,s}(n,i_1,i_2,i_3) =$$
$$\tilde{x}_1(n-i_1)\tilde{x}_1(n-i_2)\tilde{x}_1^*(n-i_3) + \tilde{x}_1^*(n-i_1)\tilde{x}_1(n-i_2)\tilde{x}_1(n-i_3)$$

$$\tilde{x}_{3,d}(n,i_1,i_2,i_2) =$$
$$\tilde{x}_1(n-i_1)\tilde{x}_2(n-i_2)\tilde{x}_2^*(n-i_2) + \tilde{x}_1(n-i_i)\tilde{x}_2^*(n-i_2)\tilde{x}_2(n-i_2)$$

$$\tilde{x}_{5,s}(n,i_1,i_2,i_3,i_4,i_5) =$$
$$\tilde{x}_1(n-i_1)\tilde{x}_1(n-i_2)\tilde{x}_1(n-i_3)\tilde{x}_1^*(n-i_4)\tilde{x}_1^*(n-i_5) +$$
$$\tilde{x}_1(n-i_1)\tilde{x}_1(n-i_2)\tilde{x}_1^*(n-i_2)\tilde{x}_1^*(n-i_3)\tilde{x}_1(n-i_4)\tilde{x}_1^*(n-i_5) +$$
$$\tilde{x}_1(n-i_1)\tilde{x}_1^*(n-i_2)\tilde{x}_1(n-i_3)\tilde{x}_1^*(n-i_4)\tilde{x}_1^*(n-i_5) +$$
$$\tilde{x}_1(n-i_1)\tilde{x}_1(n-i_2)\tilde{x}_1^*(n-i_3)\tilde{x}_1^*(n-i_4)\tilde{x}_1(n-i_5) +$$
$$\tilde{x}_1^*(n-i_1)\tilde{x}_1^*(n-i_2)\tilde{x}_1^*(n-i_3)\tilde{x}_1^*(n-i_4)\tilde{x}_1(n-i_5) +$$
$$\tilde{x}_1(n-i_1)\tilde{x}_1^*(n-i_2)\tilde{x}_1^*(n-i_3)\tilde{x}_1^*(n-i_4)\tilde{x}_1(n-i_5) +$$
$$\tilde{x}_1^*(n-i_1)\tilde{x}_1(n-i_2)\tilde{x}_1^*(n-i_3)\tilde{x}_1(n-i_4)\tilde{x}_1(n-i_5) +$$
$$\tilde{x}_1^*(n-i_1)\tilde{x}_1^*(n-i_2)\tilde{x}_1(n-i_3)\tilde{x}_1(n-i_4)\tilde{x}_1(n-i_5)$$

$$\tilde{x}_{5,d1}(n,i_1,i_2,i_3,i_4,i_5) =$$
$$\tilde{x}_1(n-i_1)\tilde{x}_1(n-i_2)\tilde{x}_1^*(n-i_3)\tilde{x}_2(n-i_4)\tilde{x}_1(n-i_5) +$$
$$\tilde{x}_1(n-i_1)\tilde{x}_1^*(n-i_2)\tilde{x}_2(n-i_3)\tilde{x}_2(n-i_4)\tilde{x}_2^*(n-i_5) +$$
$$\tilde{x}_1^*(n-i_1)\tilde{x}_1(n-i_2)\tilde{x}_1(n-i_3)\tilde{x}_2(n-i_4)\tilde{x}_2^*(n-i_5) +$$
$$\tilde{x}_1(n-i_1)\tilde{x}_1^*(n-i_2)\tilde{x}_1(n-i_3)\tilde{x}_2^*(n-i_4)\tilde{x}_2(n-i_5) +$$
$$\tilde{x}_1(n-i_1)\tilde{x}_1^*(n-i_2)\tilde{x}_1(n-i_3)\tilde{x}_2^*(n-i_4)\tilde{x}_2(n-i_5) +$$
$$\tilde{x}_1^*(n-i_1)\tilde{x}_1(n-i_2)\tilde{x}_2(n-i_3)\tilde{x}_2^*(n-i_4)\tilde{x}_2(n-i_5)$$

$$\tilde{x}_{5,d2}(n,i_1,i_2,i_3,i_4,i_5) =$$
$$\tilde{x}_1(n-i_1)\tilde{x}_2(n-i_2)\tilde{x}_2(n-i_3)\tilde{x}_2^*(n-i_4)\tilde{x}_2^*(n-i_5) +$$
$$\tilde{x}_1(n-i_1)\tilde{x}_2(n-i_2)\tilde{x}_2^*(n-i_3)\tilde{x}_2(n-i_4)\tilde{x}_2^*(n-i_5) +$$
$$\tilde{x}_1(n-i_1)\tilde{x}_2(n-i_2)\tilde{x}_2^*(n-i_3)\tilde{x}_2^*(n-i_4)\tilde{x}_2(n-i_5) +$$
$$\tilde{x}_1(n-i_1)\tilde{x}_2^*(n-i_2)\tilde{x}_2(n-i_3)\tilde{x}_2(n-i_4)\tilde{x}_2^*(n-i_5) +$$
$$\tilde{x}_1(n-i_1)\tilde{x}_2^*(n-i_2)\tilde{x}_2(n-i_3)\tilde{x}_2^*(n-i_4)\tilde{x}_2(n-i_5) +$$
$$\tilde{x}_1(n-i_1)\tilde{x}_2^*(n-i_2)\tilde{x}_2^*(n-i_3)\tilde{x}_2(n-i_4)\tilde{x}_2(n-i_5)$$

In (28), $M_1$, $M_{3,s}$, $M_{3,d}$, $M_{5,s}$, $M_{5,d1}$ and $M_{3,d2}$ denote the memory depth of the first, third, and fifth order Volterra series distortion terms. The dual-band complex valued BBE Volterra Series in (28) includes only nonlinear distortion products of up to order 5. Expression of the dual band BBE Volterra model with higher nonlinearity can be similarly derived. In addition, only odd powered terms are retained and even terms are discarded since they do not appear in the pass band. It is worth mentioning that the distortion terms $\tilde{x}_{3,s}(n, i_1, i_2, i_3)$ and $\tilde{x}_{5,s}(n, i_1, i_2, i_3, i_4, i_5)$ are linear combinations of three third and ten fifth order distortion products, respectively.

According to (28) and FIG. 5, the BBE Volterra is formed by two categories of distortion terms, namely self-distortion terms 20 and inter-band band distortion terms 22. Each of these two families of terms represents a different dynamic distortion mechanism and therefore call for different values for memory depth $M_1$, $M_{3,s}$, $M_{3,d}$, $M_{5,s}$, $M_{5,d1}$ and $M_{5,d2}$ as shown in (28). Here, $M_1$, $M_{3,s}$ and $M_{5,s}$ represent the memory depth of the first, third and fifth order of the self-dynamic distortion terms, respectively, and $M_{3,d}$, $M_{5,d1}$ and $M_{5,d2}$ represent the memory depth of the third and fifth order inter-band dynamic distortion terms. Hence, the proposed model formulation provides the capacity to separate memory depth values in each distortion mechanism as opposed to the other approaches, such as 2D-DPD, that use a global memory depth parameter M for all of the distortion terms. This represents an additional degree of freedom for limiting the implementation complexity of the multiband BBE.

An example of the dual band BBE Volterra model of (28) is given for NL=3 and $M_1=M_{3,s}=M_{3,d}=1$ in (29).

$$\tilde{y}(n) = \tilde{h}_{\omega_1,1}(0)\tilde{x}_1(n) + \tilde{h}_{\omega_1,1}(1)\tilde{x}_1(n-1) + 3\tilde{h}_{\omega_1,3,s}(0,0,0)\tilde{x}_1(n)\tilde{x}_1(n)\tilde{x}_1^*(n) + \tilde{h}_{\omega_1,3,s}(0,0,1)(2\tilde{x}_1(n)\tilde{x}_1(n-1)\tilde{x}_1^*(n) + \tilde{x}_1(n)\tilde{x}_1(n)\tilde{x}_1^*(n-1)) + \tilde{h}_{\omega_1,3,s}(0,1,1)(2\tilde{x}_1(n)\tilde{x}_1(n-1)\tilde{x}_1^*(n-1) + \tilde{x}_1(n-1)\tilde{x}_1(n-1)\tilde{x}_1^*(n)) + 3\tilde{h}_{\omega_1,3,s}(1,1,1)\tilde{x}_1(n-1)\tilde{x}_1(n-1)\tilde{x}_1^*(n-1) + 2\tilde{h}_{\omega_1,3,d}(0,0,0)\tilde{x}_1(n)\tilde{x}_2(n)\tilde{x}_2^*(n) + \tilde{h}_{\omega_1,3,d}(0,0,1)(\tilde{x}_1(n)\tilde{x}_2(n)\tilde{x}_2^*(n-1) + \tilde{x}_1(n)\tilde{x}_2^*(n)\tilde{x}_2(n-1)) + 2\tilde{h}_{\omega_1,3,d}(0,1,1)\tilde{x}_1(n)\tilde{x}_2(n-1)\tilde{x}_2^*(n-1) + 2\tilde{h}_{\omega_1,3,d}(1,0,0)\tilde{x}_1(n-1)\tilde{x}_2(n)\tilde{x}_2^*(n) + \tilde{h}_{\omega_1,3,d}(1,0,1)(\tilde{x}_1(n-1)\tilde{x}_2(n)\tilde{x}_2^*(n-1) + \tilde{x}_1(n-1)\tilde{x}_2^*(n)\tilde{x}_2(n-1)) + 2\tilde{h}_{\omega_1,3,d}(1,1,1)\tilde{x}_1(n-1)\tilde{x}_2(n-1)\tilde{x}_2^*(n-1) \quad (29)$$

A close examination of (28) reveals a number of important attributes of the dual band BBE Volterra model: Inclusion of all the possible distortion terms attributed to the static and dynamic nonlinear behavior of the PA. These involve either only the envelope of the first band signal, e.g. $\tilde{x}_1^*(n)$ $\tilde{x}_1^2(n)$, and $\tilde{x}_1^*(n)\tilde{x}_1(n)\tilde{x}_1(n-1)$, or result from the mixing between the two bands' envelopes, e.g. $\tilde{x}_1(n)\tilde{x}_2^*(n)\tilde{x}_2(n)$, and $\tilde{x}_1(n)\tilde{x}_2^*(n-1)\tilde{x}_2(n)$. A large number of the distortion terms included in (28) were not incorporated in the 2D-DPD model (i.e., $\tilde{x}_2^*(n)\tilde{x}_2(n)\tilde{x}_1(n-1)$ and $\tilde{x}_2^*(n-1)\tilde{x}_2(n)\tilde{x}_1(n-1)$).

While the dual band BBE Volterra model described herein includes larger number of distortion products than other models, according to (28) these products are grouped into different sets. Each set forms a distortion term, e. g. the distortion term $\tilde{x}_{3,s}(n, i_1, i_2, i_3)$ represents the grouping of the following distortion products $\tilde{x}_1(n-i_1)\tilde{x}_1(n-i_2)\tilde{x}_1^*(n-i_3)$, $\tilde{x}_1(n-i_1)\tilde{x}_1^*(n-i_2)\tilde{x}_1(n-i_3), \tilde{x}_1^*(n-i_1)\tilde{x}_1(n-i_2)\tilde{x}_1(n-i_3)$. The distortion products that belong to a given set share the same kernel. For example, for every possible triplet $(i_1, i_2, i_3) \in \{0 \ldots M\}^3$, three $3^{rd}$ order distortion products are combined to form $\tilde{x}_{3,s}(n, i_1, i_2, i_3)$ and consequently share one kernel $\tilde{h}_{\omega_1,3,s}(i_1, i_2, i_3)$ in (28). Similarly, for every possible quintuplet $(i_1, i_2, i_3, i_4, i_5) \in \{0 \ldots M\}^5$, ten $5^{th}$ order distortion products are combined to form $\tilde{x}_{5,s}(n, i_1, i_2, i_3, i_4, i_5)$ and share one kernel $\tilde{h}_{\omega_1,5,s}(i_1, i_2, i_3, i_4, i_5)$ in (28). Hence, despite the fact that the models described herein involve more distortion terms, the models use comparable numbers of kernels compared to the 2D-DPD scheme.

The expression of the dual band BBE Volterra model of (28) preserves the linearity property with respect to its coefficients. Hence, the least square error (LSE) estimator can be applied to identify the kernels in (28) for a given RF PA. Equation (30) details the expression used to compute the LSE solution of (28):

$$A \cdot h = Y \quad (30)$$

where A denotes the distortion products matrix, h is the kernels' vector to be estimated and Y is the vector formed by the output signal sample. Each of these variables (A, h and Y) is defined in (31) where L represents the data stream size:

$$A = \begin{pmatrix} \tilde{x}_{1,s}(M_1+1) & \cdots & \tilde{x}_{1,s}(1) & \tilde{x}_{3,s}(M_{3,s}+1,0,0,0) & \cdots & \tilde{x}_{3,s}(1,M_{3,s},M_{3,5},M_{3,s}) & \tilde{x}_{3,d}(M_{3,d}\_1,0,0,0,0,0) & \cdots & \cdots \\ \vdots & & \vdots & \vdots & & \vdots & \vdots & & \vdots \\ \vdots & \ddots & \vdots & \vdots & \ddots & \vdots & \vdots & & \ddots & \vdots \\ \tilde{x}_{1,s}(L) & \cdots & \tilde{x}_{1,s}(L-M_1) & \tilde{x}_{3,s}(L,0,0,0) & \cdots & \tilde{x}_{3,s}(L-M_{3,s},M_{3,s},M_{3,5},M_{3,5}) & \tilde{x}_{3,d}(L,0,0,0,0,0) & \cdots & \cdots \end{pmatrix}$$

$$h = (h_0 \cdots h_{M_1} \; h_{0,0,0} \; \cdots)^T,$$

$$Y = (\tilde{y}_{1,0}(M_1+1) \cdots \tilde{y}_{1,0}(L))^T \quad (31)$$

The LSE solution to equation (30) is computed using:

$$\hat{h} = (A^T \cdot A)^{-1} \cdot A^T \cdot Y \quad (32)$$

where $\hat{h}$ is the estimate of h.

To summarize the approach, a discrete base band equivalent, BBE, Volterra series is generated based on a received multi-band signal. The series has distortion products grouped according to determined shared kernels. The shared kernels are determined based on a transformation of a real-valued continuous-time pass band Volterra series without pruning of kernels. The transformation includes transforming the real-valued continuous time pass band Volterra series to a multi-frequency complex-valued envelope series. The multi-frequency complex-valued envelope signal is then transformed to a continuous-time pass band-only series. The continuous-time pass band-only signal is transformed to a continuous-time baseband equivalent series. The continuous-time baseband equivalent signal is discretized to produce the discrete base band equivalent Volterra series. Shared kernels of the discrete base band equivalent Volterra series are identified, where each shared kernel has distortion products in common with another shared kernel.

To assess the performance of the model described above, the formulation was used to model and linearize a high power dual-band RF PA. The device under test was a broadband 45 W single ended GaN PA driven with a dual-band multi-standard signal. Three test scenarios are defined:

Case 1: 20MHz (1001) WCDMA and 20 MHz LTE signals centered @2.1 GHz and 2.2 GHz respectively. The PAPR of the dual-band signal is equal to 10.3 dB.

Case 2: 20 MHz (1001) WCDMA and 20 MHz LTE signals centered @2.1 GHz and 2.4 GHz, respectively. The PAPR of the dual-band signal is equal to 10.3 dB.

Case 3: 20 MHz 4 C WCDMA and 20 MHz LTE signals centered @2.1 GHz and 2.8 GHz respectively. The PAPR of the dual-band signal is equal to 10.1 dB.

The proposed dual-band BBE Volterra and 2D-DPD models were each used to linearize a DUT PA. The training of the two models was conducted using samples of the PA output signals in each band sampled at 100MSPS. The nonlinearity order and memory depth of each model were individually set to achieve the best performance versus complexity trade-off in each case. For the first and third cases, the 2D-DPD and dual-band BBE Volterra parameters were set to (NL=7 and M=3) and (NL=7, $M_1=2$, $M_{3,s}=M_{3,d}=1$, $M_{5,s}=M_{5,d1}=M_{5,d2}=0$, $M_{7,s}=0$), respectively. However, in Case 2, (NL=9 and M=3) and (NL=9, $M_1=2$, $M_{3,s}=M_{3,d}=1$, $M_{5,s}=M_{5,d1}=M_{5,d2}=0$, $M_7=0$, $M_9=0$) were found to be adequate for the 2D-DPD and the dual-band BBE Volterra, respectively.

The linearization results for the three test scenarios are shown in FIGS. 6-11 and summaries of the corresponding performances are given in Table I-III. In each of FIGS. 6-11 the results are given for no DPD, for 2D-DPD and for the linearization method described herein. In all test scenarios, the DIDO BBE Volterra model successfully linearized the PA with significantly lower complexity and slightly better performance than the 2D-DPD model. A reduction of the spectrum regrowth of about 20 dB and an ACPR of about 50 dBc were achieved by the dual-band BBE Volterra in all test scenarios.

TABLE I

Dual band standard linearization results: Case 1

| | Without DPD | | With Volterra DPD | | With 2D-DPD | |
|---|---|---|---|---|---|---|
| | Band 1 @ 2.1 GHz | Band 2 @ 2.2 GHz | Band 1 @ 2.1 GHz | Band 2 @ 2.2 GHz | Band 1 @ 2.1 GHz | Band 2 @ 2.2 GHz |
| Number of coefficients | 0 | 0 | 20 | 20 | 84 | 84 |
| NMSE (dB) | −19 | −18 | −38 | −37 | −37 | −36 |
| ACLR (dBc) | −35 | −27 | −51 | −48 | −50 | −46 |

TABLE II

Dual band standard linearization results: Case 2

| | Without DPD | | With Volterra DPD | | With 2D-DPD | |
|---|---|---|---|---|---|---|
| | Band 1 @ 2.1 GHz | Band 2 @ 2.4 GHz | Band 1 @ 2.1 GHz | Band 2 @ 2.4 GHz | Band 1 @ 2.1 GHz | Band 2 @ 2.4 GHz |
| Number of coefficients | 0 | 0 | 25 | 25 | 135 | 135 |
| NMSE (dB) | −18 | −17 | −38 | −36 | −36 | −36 |
| ACLR (dBc) | −35 | −25 | −51 | −47 | −48 | −45 |

TABLE III

Dual band standard linearization results: Case 3

| | Without DPD | | With Volterra DPD | | With 2D-DPD | |
|---|---|---|---|---|---|---|
| | Band 1 @ 2.1 GHz | Band 2 @ 2.8 GHz | Band 1 @ 2.1 GHz | Band 2 @ 2.8 GHz | Band 1 @ 2.1 GHz | Band 2 @ 2.8 GHz |
| Number of coefficients | 0 | 0 | 20 | 20 | 84 | 84 |
| NMSE (dB) | −19 | −17 | −38 | −35 | −36 | −35 |
| ACLR (dBc) | −32 | −27 | −48 | −47 | −47 | −47 |

Figure 12:
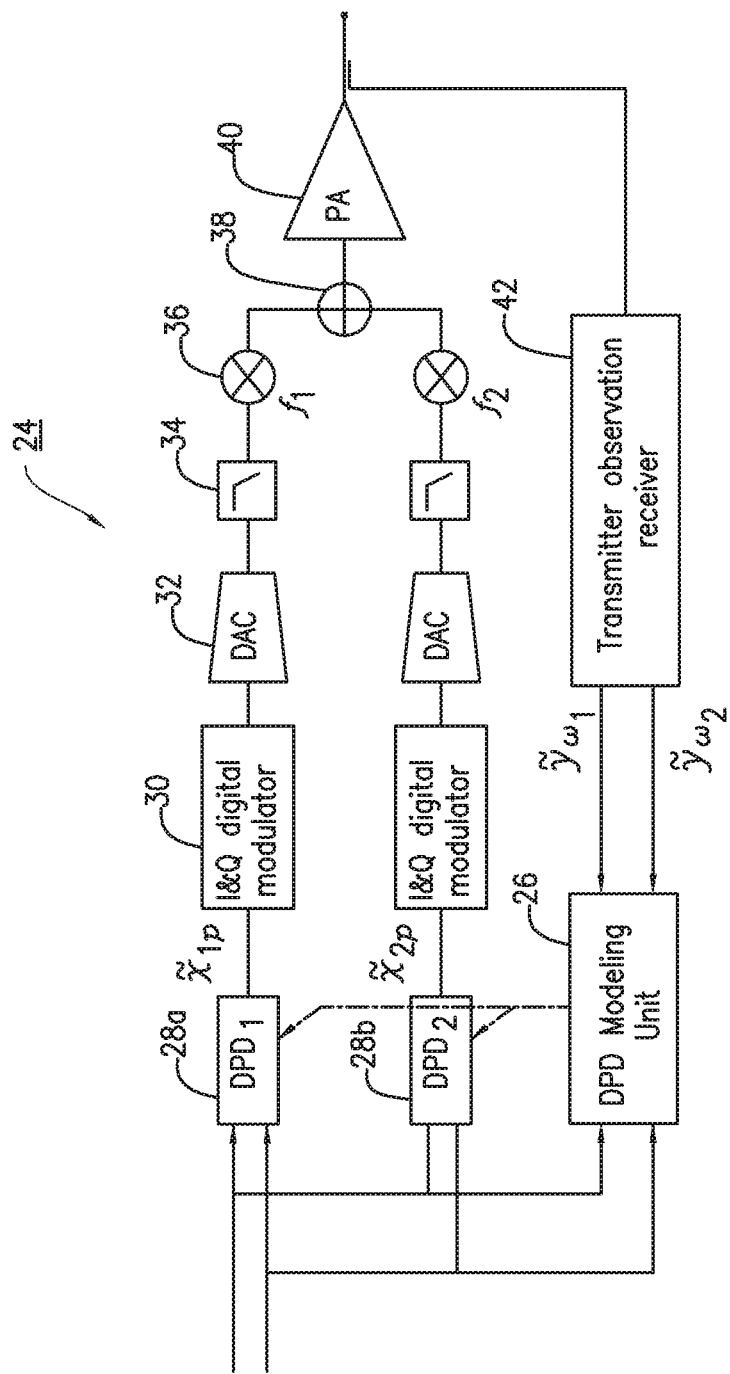
FIG. 12 is a block diagram of a digital pre-distortion power amplification system constructed in accordance with principles of the present invention.

FIG. 12 is a block diagram of a power amplification system 24 having a digital pre-distorter modelling unit 26 implementing the dual band BBE Volterra model presented herein. Note that although FIG. 12 shows only two bands, the invention is not limited to two bands but rather, can be implemented for more than two bands according to the steps described above. The power amplification system 24 includes digital pre-distorters 28a and 28b, referred to collectively as DPDs 28. The DPDs 28 receive input from the pre-distorter modelling unit 26, and pre-distort the input signals $\tilde{x}_1$ and $\tilde{x}_2$ to produce pre-distorted signals $\tilde{x}_{1p}$ and $\tilde{x}_{2p}$. Each pre-distorted signal is input to a digital modulator 30 to impress the baseband signal onto a respective carrier, converted to analog by a digital (A/D) to analog converter 32, low pass filtered by a filter 34, and mixed to radio frequency (RF) by a mixer 36 to prepare the signal for amplification by an RF PA amplifier. Accordingly, the RF signals in the two paths are summed by an adder 38 and input to a power amplifier 40. A transmitter observation receiver 42 samples the output of the power amplifier 40 in each band and produces output signals $y_{w1}$ and $y_{w2}$. These output signals are used by the DPD modeling unit 26 to derive the kernel vector h according to equation (30). The DPD modelling unit 26 calculates a discrete baseband equivalent Volterra series having distortion products grouped according to determined shared kernels, where the shared kernels are based on a transformation of a real-valued continuous-time pass band Volterra series without pruning of kernels.

Figure 13:
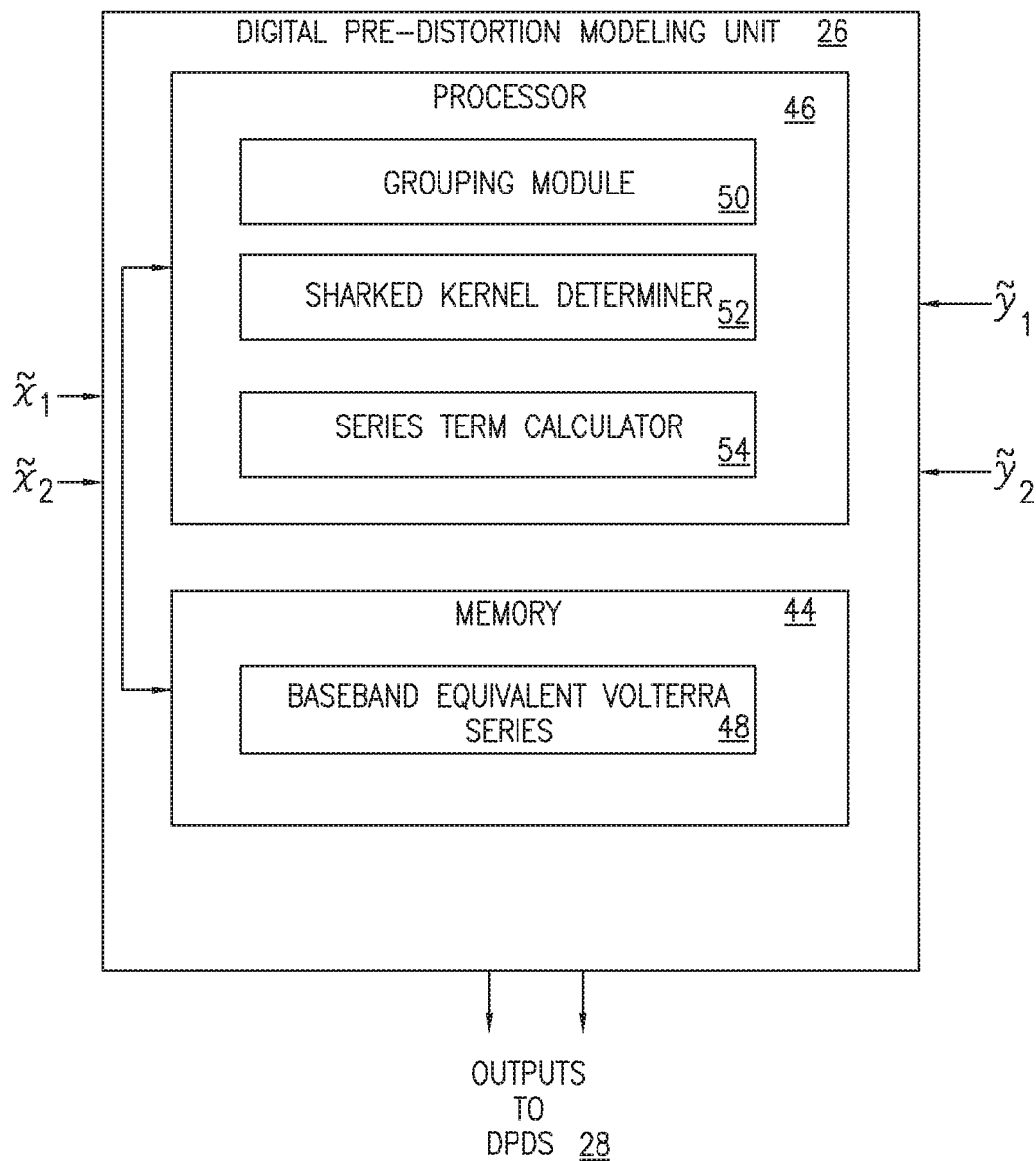
FIG. 13 is a block diagram of a DPD modelling unit constructed in accordance with principles of the present invention.

FIG. 13 is a more detailed view of the DPD modelling unit 26, which includes a memory module 44 in communication with a processor 46. The DPD modelling unit 26 receives the input signals $\tilde{x}_1$ and $\tilde{x}_2$ and output signals $\tilde{y}_{\omega 1}$ and $\tilde{\omega}_{\omega 2}$ from the transmitter observation receiver 42 and derives the modelling vector h according to equation (32). The modelling vector h. is input to the DPDs 28 to pre-distort the input signals $\tilde{x}_1$ and $\tilde{x}_2$ to produce pre-distorted signals $\tilde{x}_{1p}$ and $\tilde{x}_{2p}$. The processor 46 includes a grouping module 50, a shared kernel determiner 52 and a series term computer 54. The grouping module is configured to group distortion products of the series according to determined shared kernels. The shared kernel determiner is configured to determine the shared kernels based on a transformation of a real-valued continuous-time pass band Volterra series without pruning of kernels. The series term calculator is configured to calculate the terms of the discrete base band equivalent Volterra series, the terms being the distortion products multiplied by their respective shared kernels. The memory module 44 is configured to store terms of the discrete base band equivalent (BBE) Volterra series 48, generated by the processor 46.

Figure 14:
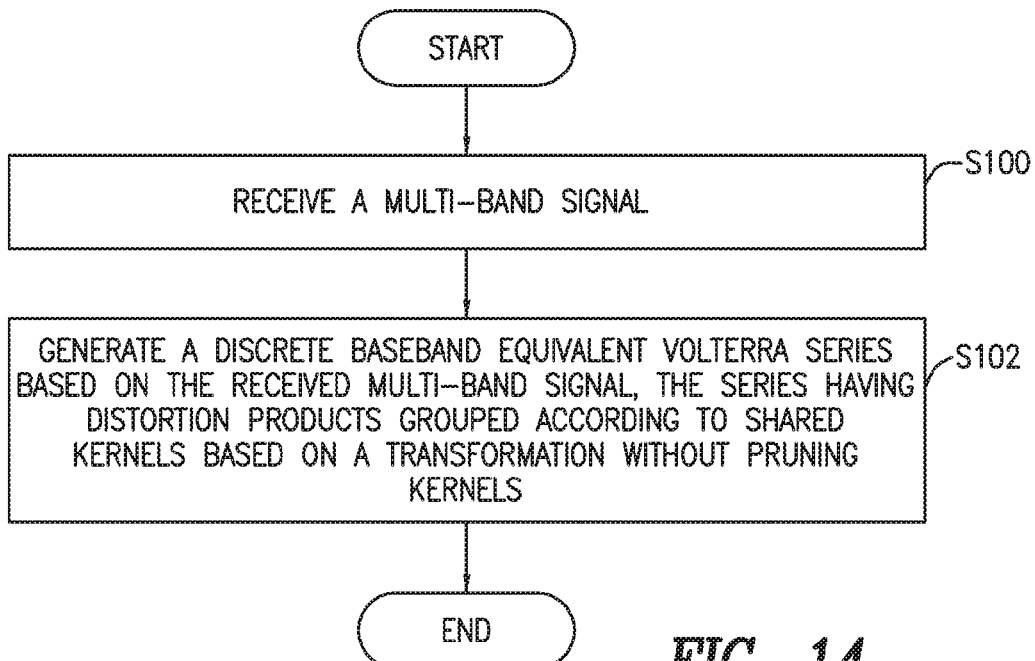
FIG. 14 is a flowchart of an exemplary process of modelling a power amplifier fed by a multi-band input signal.

FIG. 14 is a flowchart of a process for modelling a power amplifier 40 fed by a multi-band input signal. A multi-band signal is received by a digital pre-distorter 28 (block S100). A discrete BBE Volterra series is generated by the DPD modelling unit 26 based on the received multi-band input signal (block S102). The series has distortion products that are grouped by the grouping module 50 according to determined shared kernels determined by shared kernel determiner 52. The shared kernels are determined based on a transformation of a real-valued continuous-time pass band Volterra series without pruning of kernels.

Figure 15:
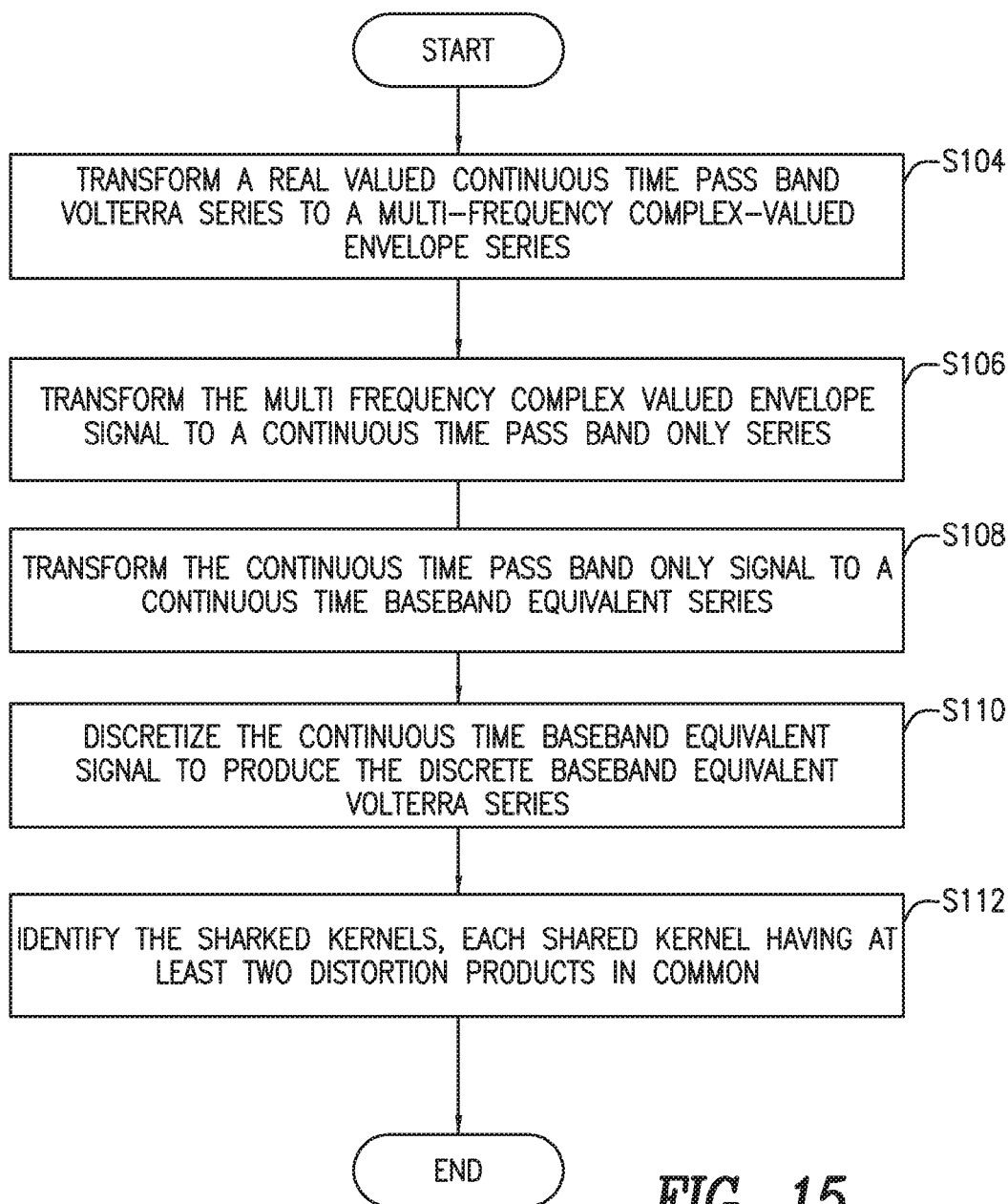
FIG. 15 is a flowchart of an exemplary process of transforming a real-valued continuous-time pass band Volterra series to a discrete base band equivalent (BBE) Volterra series.

FIG. 15 is a flowchart of a process for transforming a real-valued continuous time pass band Volterra series to a discrete base band equivalent Volterra series in which shared kernels are identified as set out in block S102 of FIG. 14. The real-valued continuous time pass band Volterra series is transformed to a multi-frequency complex-valued envelope series (block S104). The multi-frequency complex-valued envelope signal is transformed to a continuous-time pass band-only series (block S106). The continuous-time pass band-only signal is transformed to a continuous-time baseband equivalent series (block S108). The continuous-time baseband equivalent signal is discretized to produce the discrete base band equivalent Volterra series (block S110). Shared kernels of the discrete base band equivalent Volterra series are identified, where a shared kernel has distortion products in common with another shared kernel (block S112).

Figure 16:
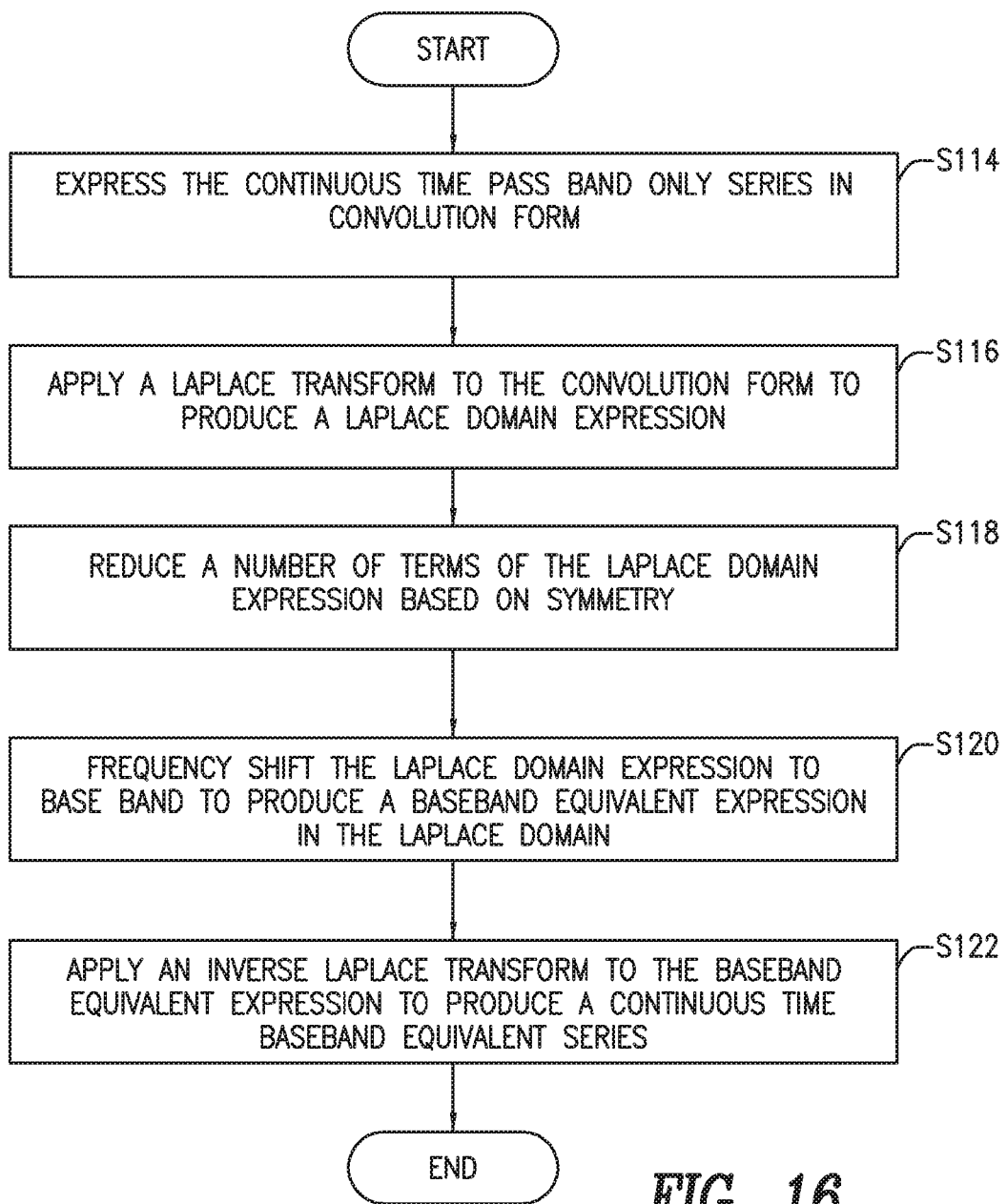
FIG. 16 is a flowchart of an exemplary process of transforming a continuous-time pass band series to a continuous-time baseband equivalent series.

FIG. 16 is a flowchart of a process of transforming the continuous-time pass band-only signal to a continuous-time baseband equivalent signal as shown in block S108 of FIG. 15. The continuous-time pass band-only series is expressed in convolution form (block S114). Then, the Laplace transform is applied to the convolution form to produce a Laplace domain expression (block S116). A number of terms in the Laplace domain expression may be reduced based on symmetry (block S118). The Laplace domain expression is frequency-shifted to baseband to produce a baseband equivalent expression in the Laplace domain (block S120). An inverse Laplace transform is applied to the baseband equivalent expression to produce the continuous-time baseband equivalent series (block S122).

Figure 17:
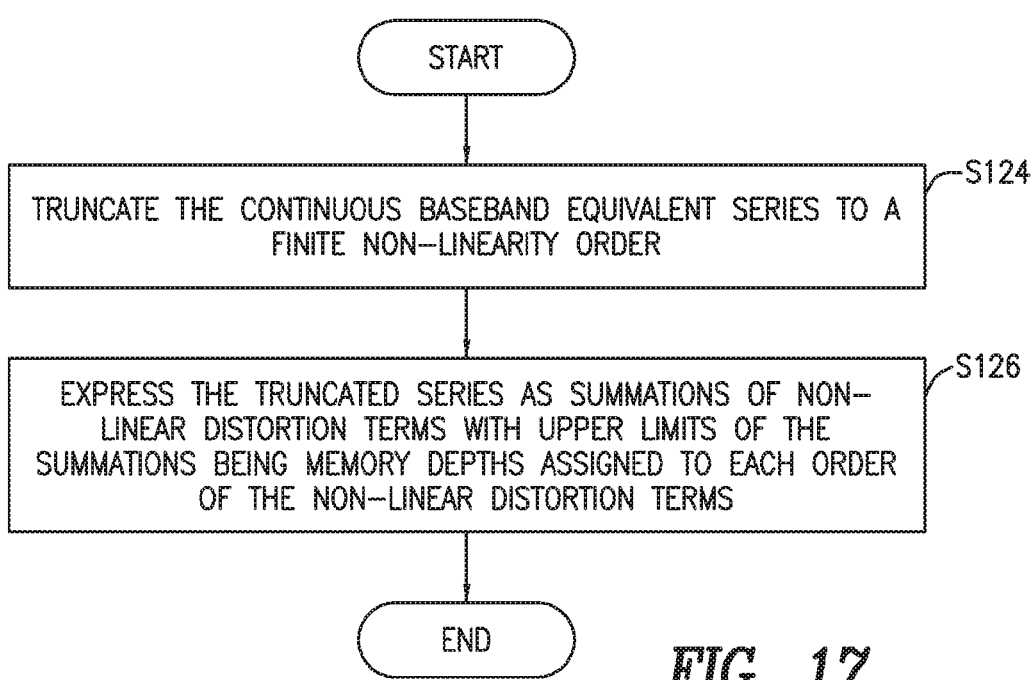
FIG. 17 is a flowchart of an exemplary process of discretizing the continuous-time baseband equivalent series to produce the discrete base band equivalent Volterra series.

FIG. 17 is a flowchart of a process of discretizing the continuous-time baseband equivalent series to produce the discrete base band equivalent Volterra series, as shown in block S110 of FIG. 15. The process includes truncating the continuous-time baseband equivalent series to a finite non-linearity order (block S124). The process also includes expressing the truncated series as summations of non-linear distortion terms, with upper limits of the summations being memory depths assigned to each order of the non-linear distortion terms (block S126).

Thus, a dual band BBE Volterra series-based behavioral model has been described herein to mimic and linearize the dynamic nonlinear behavior of a concurrently driven dual-band amplifier. Starting with a real-valued, continuous-time, pass band Volterra series and using a number of signal and system transformations, a low complexity complex-valued, and discrete BBE Volterra formulation was derived. While the formulation presented herein includes all possible distortion terms, it involved fewer kernels than its 2D-DPD counterpart. The model is successfully applied to digitally predistort and linearize a dual-band 45 Watt class AB GaN PA driven with different dual-band dual-standard test signals. For each band, the model used less than 25 coefficients to reduce the ACLR by up to 25 dB.

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope and spirit of the invention, which is limited only by the following claims

What is claimed is:

1. A method of modelling a power amplifier fed by a multi-band signal input, the method comprising:
  receiving a multi-band signal;
  generating a discrete base band equivalent, BBE, Volterra series based on the received multi-band signal, the discrete BBE Volterra series having distortion products grouped according to determined shared kernels, the discrete BBE Volterra series being used to model the power amplifier; and
  applying the discrete BBE Volterra series to pre-distort the multi-band signal and to linearize the power amplifier; and
  the shared kernels being determined based on a transformation of a real-valued continuous-time pass band Volterra series without pruning of kernels.

2. The method of claim 1, wherein the shared kernels are determined based on the transformation of the real-valued continuous-time pass band Volterra series by:
  transforming the real-valued continuous time pass band Volterra series to a multi-frequency complex-valued envelope series;
  transforming the multi-frequency complex-valued envelope signal to a continuous-time pass band-only series;
  transforming the continuous-time pass band-only signal to a continuous-time baseband equivalent series;
  discretizing the continuous-time baseband equivalent signal to produce the discrete base band equivalent Volterra series; and
  identifying the shared kernels, each shared kernel having distortion products in common with another shared kernel.

3. The method of claim 2, wherein transforming the continuous-time pass band-only signal to a continuous-time baseband equivalent signal includes:
  expressing the continuous-time pass band-only series in convolution form;
  applying a Laplace transform to the convolution form to produce a Laplace domain expression;
  frequency shifting the Laplace domain expression to baseband to produce a baseband equivalent expression in the Laplace domain; and
  applying an inverse Laplace transform to the baseband equivalent expression to produce the continuous-time baseband equivalent series.

4. The method of claim 3, wherein a number of terms in the Laplace domain expression are reduced via symmetry.

5. The method of claim 3, further comprising grouping terms of the Laplace domain expression based on frequency intervals where distortion terms are not zero.

6. The method of claim 2, wherein discretizing the continuous-time baseband equivalent series to produce the discrete base band equivalent Volterra series includes:
  truncating the continuous-time baseband equivalent series to a finite non-linearity order; and
  expressing the truncated series as summations of non-linear distortion terms, with upper limits of the summations being memory depths assigned to each order of the non-linear distortion terms.

7. The method of claim 6, wherein a distortion term is a group of distortion products multiplied by a shared kernel.

8. A digital pre-distorter (DPD) system including a power amplifier receiving a multi-band input, the system comprising:
   a Volterra series DPD modelling unit, the DPD modelling unit configured to:
      calculate a discrete base band equivalent, BBE, Volterra series, the discrete BBE Volterra series having distortion products grouped according to determined shared kernels;
      applying the discrete BBE Volterra series to pre-distort the multi-band signal and to linearize the power amplifier; and
      the shared kernels being determined based on a transformation of a real-valued continuous-time pass band Volterra series without pruning of kernels.

9. The DPD system of claim 8,
   wherein the power amplifier is configured to produce an output in response to the multi-band input, the output of the power amplifier provided to the Volterra series DPD modelling unit to enable the Volterra series DPD modeling unit to compute the shared kernels based on the output of the power amplifier.

10. The DPD system of claim 9, further comprising a transmitter observation receiver configured to sample the output of the power amplifier and provide the sampled output to the Volterra series DPD modelling unit.

11. The DPD system of claim 8, wherein the distortion products and their associated kernels are determined by:
   transforming the real-valued continuous time pass band Volterra series to a multi-frequency complex-valued envelope series;
   transforming the multi-frequency complex-valued envelope signal to a continuous-time pass band-only series;
   transforming the continuous-time pass band-only signal to a continuous-time baseband equivalent series;
   discretizing the continuous-time baseband equivalent signal to produce the discrete base band equivalent Volterra series; and
   identifying the shared kernels, each shared kernel having distortion products in common with another shared kernel.

12. The DPD system of claim 11, wherein transforming the continuous-time pass band-only signal to a continuous-time baseband equivalent signal includes:
   expressing the continuous-time pass band-only series in convolution form;
   applying a Laplace transform to the convolution form to produce a Laplace domain expression;
   frequency shifting the Laplace domain expression to baseband to produce a baseband equivalent expression in the Laplace domain; and
   applying an inverse Laplace transform to the baseband equivalent expression to produce the continuous-time baseband equivalent series.

13. The DPD system of claim 12, wherein a number of terms in the Laplace domain expression are reduced via symmetry.

14. The DPD system of claim 12, wherein transforming the continuous-time pass band-only signal to a continuous-time baseband equivalent signal further comprises grouping terms of the Laplace domain expression based on frequency intervals where distortion terms are not zero.

15. The DPD system of claim 11, wherein discretizing the continuous-time baseband equivalent series to produce the discrete base band equivalent Volterra series includes:
   truncating the continuous-time baseband equivalent series to a finite non-linearity order; and
   expressing the truncated series as summations of non-linear distortion terms, with upper limits of the summations being memory depths assigned to each order of the non-linear distortion terms.

16. The DPD system of claim 15, wherein a distortion term is a group of distortion products multiplied by a shared kernel.

17. A Volterra series digital pre-distorter, DPD, modelling unit for modeling distortion of a power amplifier receiving a multi-band input, the modelling unit comprising:
   a memory module, the memory module configured to store terms of a discrete base band equivalent, BBE, Volterra series;
   a grouping module, the grouping module configured to group distortion products of the discrete BBE Volterra series according to determined shared kernels;
   a shared kernel determiner, the shared kernel determiner configured to determine the shared kernels based on a transformation of a real-valued continuous-time pass band Volterra series without pruning of kernels; and
   a series term calculator, the series term calculator configured to calculate the terms of the discrete base band equivalent Volterra series, the terms being the distortion products multiplied by their respective shared kernels;
   the modelling unit being further configured to send the discrete BBE Volterra series to a digital pre-distorter to pre-distort the multi-band signal and to linearize the power amplifier.

18. The Volterra series DPD modelling unit of claim 17, wherein the BBE Volterra series terms are based on the multi-band input.

19. The Volterra series DPD modelling unit of claim 18, wherein the multi-band input is a dual band input.

20. The Volterra series DPD modelling unit of claim 17, wherein the shared kernel determiner is further configured to determine the shared kernels via a least squares estimate based on the multi-band input and an output of the power amplifier.

21. The Volterra series DPD modelling unit of claim 17, wherein the kernels and distortion products are derived from the real-valued continuous-time pass band Volterra series by:
   transforming the real-valued continuous time pass band Volterra series to a multi-frequency complex-valued envelope series;
   transforming the multi-frequency complex-valued envelope signal to a continuous-time pass band-only series;
   transforming the continuous-time pass band-only signal to a continuous-time baseband equivalent series;
   discretizing the continuous-time baseband equivalent signal to produce the discrete base band equivalent Volterra series; and
   identifying the shared kernels, each shared kernel having distortion products in common.

* * * * *